United States Patent
Goto et al.

(10) Patent No.: US 12,470,199 B2
(45) Date of Patent: Nov. 11, 2025

(54) ACOUSTIC WAVE DEVICE WITH VERTICALLY MASS LOADED MULTI-LAYER INTERDIGITAL TRANSDUCER ELECTRODE FOR TRANSVERSE MODE SUPPRESSION

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 105 days.

(21) Appl. No.: 18/069,115

(22) Filed: Dec. 20, 2022

(65) Prior Publication Data

US 2023/0223917 A1    Jul. 13, 2023

Related U.S. Application Data

(60) Provisional application No. 63/266,740, filed on Jan. 13, 2022, provisional application No. 63/266,737, filed on Jan. 13, 2022.

(51) Int. Cl.
*H03H 9/02* (2006.01)
*H03H 3/08* (2006.01)
(Continued)

(52) U.S. Cl.
CPC .......... *H03H 9/02661* (2013.01); *H03H 3/08* (2013.01); *H03H 9/02614* (2013.01); *H03H 9/131* (2013.01); *H03H 9/6489* (2013.01)

(58) Field of Classification Search
CPC ........... H03H 9/02574; H03H 9/02834; H03H 9/02559; H03H 9/25; H03H 9/6483;
(Continued)

(56) References Cited

U.S. PATENT DOCUMENTS

| | | |
|---|---|---|
| 5,646,584 A | 7/1997 | Kondratyev et al. |
| 5,895,996 A | 4/1999 | Takagi et al. |

(Continued)

FOREIGN PATENT DOCUMENTS

| | | |
|---|---|---|
| CN | 113098432 | 7/2021 |
| FR | 3105894 A1 | 7/2021 |

(Continued)

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

(Continued)

*Primary Examiner* — Lincoln D Donovan
*Assistant Examiner* — Tyler J Pereny
(74) *Attorney, Agent, or Firm* — Knobbe, Martens, Olson & Bear, LLP

(57) ABSTRACT

An acoustic wave device has a multilayer piezoelectric substrate (MPS) structure and a multilayer interdigital transducer electrode (IDT). The multilayer piezoelectric substrate includes a piezoelectric layer over a support substrate. An additional (functional) layer can optionally be interposed between the piezoelectric layer and the support substrate, which can facilitate bonding between these layers and provide temperature compensation. The multilayer IDT is disposed over the piezoelectric layer and includes a first layer of a first material with higher density and a second layer of a different material with lower density. The interdigital transducer electrode also includes (mass loading) strips disposed over (e.g., adjacent, in contact with) the second layer, which advantageously facilitate suppression of transverse mode.

21 Claims, 19 Drawing Sheets

(51) Int. Cl.
*H03H 9/13* (2006.01)
*H03H 9/64* (2006.01)

(58) Field of Classification Search
CPC .. H03H 9/14541; H03H 3/08; H03H 9/02992; H03H 9/725; H03H 9/145; H03H 9/6489; H03H 9/6406; H03H 9/02228; H03H 9/64; H03H 9/02858; H03H 9/02881; H03H 9/131; H03H 9/1457; H03H 9/54; H03H 9/14544; H03H 9/02818; H03H 9/173; H03H 9/175; H03H 3/10; H03H 9/02842; H03H 9/02889; H03H 9/14538; H03H 9/02661; H03H 9/02866; H03F 2200/451; H03F 3/195; H03F 3/245; H03F 2200/111; H03F 2203/7209; H03F 3/72

See application file for complete search history.

(56) References Cited

U.S. PATENT DOCUMENTS

| | | | |
|---|---|---|---|
| 7,230,512 B1 | 6/2007 | Carpenter et al. | |
| 7,352,104 B2 | 4/2008 | Yamazaki et al. | |
| 7,554,242 B2 | 6/2009 | Aoki et al. | |
| 8,294,331 B2 | 10/2012 | Abbott et al. | |
| 8,741,683 B2 | 6/2014 | Huang et al. | |
| 9,065,424 B2 | 6/2015 | Nakanishi et al. | |
| 9,124,240 B2 | 9/2015 | Shimizu et al. | |
| 9,136,458 B2 | 9/2015 | Komatsu et al. | |
| 9,257,960 B2 | 2/2016 | Ruile et al. | |
| 9,413,330 B2 | 8/2016 | Shimizu et al. | |
| 9,419,584 B2 | 8/2016 | Tsuranari et al. | |
| 9,438,201 B2 | 9/2016 | Hori et al. | |
| 9,537,464 B2 | 1/2017 | Yamanaka | |
| 9,640,750 B2 | 5/2017 | Nakanishi et al. | |
| 9,641,152 B2 | 5/2017 | Nakamura et al. | |
| 9,673,779 B2 | 6/2017 | Ruile et al. | |
| 9,748,923 B2 | 8/2017 | Kando et al. | |
| 9,748,924 B2 | 8/2017 | Komatsu et al. | |
| 10,090,825 B2 | 10/2018 | Kuroyanagi | |
| 10,153,748 B2 | 12/2018 | Tanaka | |
| 10,361,678 B2 | 7/2019 | Iwaki et al. | |
| 10,476,470 B2 | 11/2019 | Takamine | |
| 10,483,942 B2 | 11/2019 | Goto et al. | |
| 10,574,207 B2 | 2/2020 | Yoon et al. | |
| 10,727,844 B1 | 7/2020 | Gong et al. | |
| 10,749,497 B2 | 8/2020 | Tang et al. | |
| 10,826,507 B1 | 11/2020 | Gong et al. | |
| 10,873,313 B2 | 12/2020 | Zou et al. | |
| 11,050,406 B2 | 6/2021 | Maki et al. | |
| 11,095,266 B2 | 8/2021 | Inoue et al. | |
| 11,165,411 B2 | 11/2021 | Liu et al. | |
| 11,239,817 B2 | 2/2022 | Hatano et al. | |
| 11,245,378 B2 | 2/2022 | Tang et al. | |
| 11,296,672 B2 | 4/2022 | Hiratsuka et al. | |
| 11,368,137 B2 | 6/2022 | Goto et al. | |
| 11,522,514 B2 | 12/2022 | Zou et al. | |
| 11,606,078 B2 | 3/2023 | Tang et al. | |
| 11,616,491 B2 | 3/2023 | Tang et al. | |
| 11,677,380 B2 | 6/2023 | Fujiwara et al. | |
| 11,722,122 B2 | 8/2023 | Goto et al. | |
| 11,750,172 B2 | 9/2023 | Goto et al. | |
| 11,824,515 B2 | 11/2023 | Tang et al. | |
| 11,962,283 B2 | 4/2024 | Zou et al. | |
| 12,040,784 B2 | 7/2024 | Tang et al. | |
| 12,047,053 B2 | 7/2024 | Maki et al. | |
| 2004/0222717 A1 | 11/2004 | Matsuda et al. | |
| 2005/0077982 A1 | 4/2005 | Funasaka | |
| 2008/0018417 A1 | 1/2008 | Igaki et al. | |
| 2010/0265010 A1 | 10/2010 | Jian | |
| 2012/0049968 A1 | 3/2012 | Owaki et al. | |
| 2014/0285287 A1 | 9/2014 | Komatsu et al. | |
| 2014/0339957 A1 | 11/2014 | Tajima et al. | |
| 2016/0294361 A1 | 10/2016 | Yamane et al. | |
| 2017/0063332 A1 | 3/2017 | Gilbert et al. | |
| 2017/0099043 A1 | 4/2017 | Goto et al. | |
| 2017/0104470 A1 | 4/2017 | Koelle et al. | |
| 2017/0214385 A1 | 7/2017 | Bhattacharjee | |
| 2017/0214386 A1 | 7/2017 | Kido | |
| 2017/0222618 A1 | 8/2017 | Inoue | |
| 2017/0250669 A1 | 8/2017 | Kuroyanagi et al. | |
| 2017/0272051 A1 | 9/2017 | Kurihara et al. | |
| 2017/0273183 A1 | 9/2017 | Kawasaki et al. | |
| 2017/0288629 A1 | 10/2017 | Bhattacharjee et al. | |
| 2017/0359048 A1 | 12/2017 | Yasuda | |
| 2018/0013404 A1 | 1/2018 | Kawasaki et al. | |
| 2018/0048290 A1 | 2/2018 | Sekine et al. | |
| 2018/0097501 A1 | 4/2018 | Kikuchi et al. | |
| 2018/0097508 A1 | 4/2018 | Iwamoto et al. | |
| 2018/0102760 A1 | 4/2018 | Inoue et al. | |
| 2018/0138893 A1 | 5/2018 | Caron | |
| 2018/0316329 A1 | 11/2018 | Guenard et al. | |
| 2018/0367119 A1 | 12/2018 | Lee | |
| 2019/0288661 A1 | 9/2019 | Akiyama et al. | |
| 2019/0319772 A1 | 10/2019 | Ando et al. | |
| 2019/0379347 A1 | 12/2019 | Goto et al. | |
| 2020/0036362 A1 | 1/2020 | Daimon | |
| 2020/0067482 A1 | 2/2020 | Maki et al. | |
| 2020/0106420 A1 | 4/2020 | Kodama et al. | |
| 2020/0144984 A1 | 5/2020 | Fukuhara et al. | |
| 2020/0212875 A1 | 7/2020 | Goto et al. | |
| 2020/0212876 A1* | 7/2020 | Goto | H03H 9/02228 |
| 2020/0212883 A1 | 7/2020 | Goto et al. | |
| 2020/0220522 A1 | 7/2020 | Nosaka | |
| 2020/0358424 A1 | 11/2020 | Kaneda et al. | |
| 2020/0366268 A1 | 11/2020 | Goto et al. | |
| 2020/0366270 A1 | 11/2020 | Matsuoka | |
| 2020/0389151 A1 | 12/2020 | Goto | |
| 2021/0006225 A1 | 1/2021 | Hatano | |
| 2021/0050842 A1 | 2/2021 | Tang et al. | |
| 2021/0058057 A1 | 2/2021 | Goto et al. | |
| 2021/0126616 A1 | 4/2021 | Hiramatsu et al. | |
| 2021/0167748 A1 | 6/2021 | Huck et al. | |
| 2021/0297060 A1 | 9/2021 | Omura et al. | |
| 2022/0014152 A1 | 1/2022 | Gebeyehu et al. | |
| 2022/0014175 A1 | 1/2022 | Nagatomo et al. | |
| 2022/0077840 A1 | 3/2022 | Caron | |
| 2022/0109419 A1 | 4/2022 | Esquius Morote | |
| 2022/0209738 A1* | 6/2022 | Torazawa | H03H 9/6483 |
| 2022/0271730 A1 | 8/2022 | Abbott et al. | |
| 2022/0271733 A1 | 8/2022 | Abbott et al. | |
| 2022/0271734 A1 | 8/2022 | Abbott et al. | |
| 2022/0328980 A1 | 10/2022 | Dicarlo et al. | |
| 2022/0399867 A1 | 12/2022 | Goto et al. | |
| 2022/0399871 A1 | 12/2022 | Goto et al. | |
| 2023/0013597 A1 | 1/2023 | Goto et al. | |
| 2023/0016884 A1 | 1/2023 | Goto et al. | |
| 2023/0026465 A1 | 1/2023 | Huang et al. | |
| 2023/0031568 A1 | 2/2023 | Tang et al. | |
| 2023/0032325 A1 | 2/2023 | Goto et al. | |
| 2023/0039507 A1 | 2/2023 | Kim et al. | |
| 2023/0104405 A1 | 4/2023 | Hiramatsu et al. | |
| 2023/0105726 A1 | 4/2023 | Tang et al. | |
| 2023/0107376 A1 | 4/2023 | Goto et al. | |
| 2023/0109106 A1 | 4/2023 | Hiramatsu et al. | |
| 2023/0112677 A1 | 4/2023 | Tang et al. | |
| 2023/0163748 A1 | 5/2023 | Goto et al. | |
| 2023/0208385 A1 | 6/2023 | Hiramatsu et al. | |
| 2023/0208396 A1 | 6/2023 | Hiramatsu et al. | |
| 2023/0208398 A1 | 6/2023 | Goto et al. | |
| 2023/0208399 A1 | 6/2023 | Goto et al. | |
| 2023/0223910 A1 | 7/2023 | Goto et al. | |
| 2023/0231529 A1 | 7/2023 | Hiramatsu et al. | |
| 2023/0275565 A1 | 8/2023 | Tang et al. | |
| 2023/0283261 A1 | 9/2023 | Huang et al. | |
| 2023/0327630 A1 | 10/2023 | Goto et al. | |
| 2023/0327642 A1 | 10/2023 | Goto et al. | |
| 2023/0327645 A1 | 10/2023 | Goto et al. | |
| 2023/0336152 A1 | 10/2023 | Goto et al. | |
| 2023/0336153 A1 | 10/2023 | Goto et al. | |
| 2023/0336159 A1 | 10/2023 | Hiramatsu et al. | |
| 2023/0344411 A1 | 10/2023 | Chen et al. | |
| 2023/0344415 A1 | 10/2023 | Chen et al. | |

(56) References Cited

U.S. PATENT DOCUMENTS

| | | |
|---|---|---|
| 2023/0344416 A1 | 10/2023 | Chen et al. |
| 2024/0022164 A1 | 1/2024 | Gong et al. |
| 2024/0039507 A1 | 2/2024 | Goto et al. |
| 2024/0186978 A1 | 6/2024 | Hiramatsu et al. |
| 2024/0223149 A1 | 7/2024 | Goto et al. |
| 2024/0223152 A1 | 7/2024 | Goto et al. |
| 2024/0223156 A1 | 7/2024 | Goto et al. |

FOREIGN PATENT DOCUMENTS

| | | |
|---|---|---|
| JP | 2009-219045 A | 9/2009 |
| JP | 2014-135624 A | 7/2014 |
| JP | 2020-092422 A | 6/2020 |
| WO | WO 2017/161303 A1 | 9/2017 |

OTHER PUBLICATIONS

Iwamoto et al., "Transverse Modes in I.H.P. Saw Resonator and Their Suppression Method", Murata Manufacturing co., Ltd., 4 pages (2018).

Solal et al., "A method to reduce losses in buried electrodes Rf Saw resonators", 2011 IEEE International Ultrasonics Symposium, pp. 324-332, doi: 10.1109/ULTSYM.2011.0078.

\* cited by examiner

ACOUSTIC WAVE DEVICE WITH VERTICALLY MASS LOADED MULTI-LAYER INTERDIGITAL TRANSDUCER ELECTRODE FOR TRANSVERSE MODE SUPPRESSION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices, and more particularly to acoustic wave devices with a vertically mass loaded multi-layer interdigital transducer electrode having transverse mode suppression.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY

The innovations described in the claims each have several aspects, no single one of which is solely responsible for its desirable attributes. Without limiting the scope of the claims, some prominent features of this disclosure will now be briefly described.

In accordance with one aspect of the disclosure, an acoustic wave device is provided. The acoustic wave device comprises a multilayer piezoelectric substrate (MPS) structure. In one implementation, the multilayer piezoelectric substrate can include a piezoelectric layer over a support substrate. Optionally, an additional (functional) layer can be interposed between the piezoelectric layer and the support substrate, which can facilitate bonding between these layers and provide temperature compensation. The acoustic device can include a multilayer interdigital transducer electrode disposed over the piezoelectric layer, the interdigital transducer electrode including a first layer of a first material and a second layer of a different material. The interdigital transducer electrode also includes (mass loading) strips disposed over (e.g., adjacent, in contact with) the second layer, which advantageously facilitate suppression of transverse mode.

In accordance with one aspect of the disclosure, an acoustic wave device is provided. The acoustic wave device comprises a multilayer piezoelectric substrate including a piezoelectric layer and a support substrate below the piezoelectric layer. The acoustic wave device also comprises an interdigital transducer electrode including a first layer disposed over the piezoelectric layer, a second layer disposed over the first layer, the second layer being of a less dense material than the first layer, and a pair of strips adjacent the second layer and extending over one or more fingers of the interdigital transducer electrode and having a density configured to suppress a transverse mode of the acoustic wave device.

In accordance with another aspect of the disclosure, a radio frequency module is provided. The radio frequency module comprises a package substrate and an acoustic wave filter configured to filter a radiofrequency signal. The acoustic wave filter includes an acoustic wave device that includes a multilayer piezoelectric substrate including a piezoelectric layer and a support substrate below the piezoelectric layer. An interdigital transducer electrode includes a first layer disposed over the piezoelectric layer, a second layer disposed over the first layer, the second layer being of a less dense material than the first layer, and a pair of strips adjacent the second layer and extending over one or more fingers of the interdigital transducer electrode and having a density configured to suppress a transverse mode of the acoustic wave device. The radio frequency module further comprises additional circuitry, the acoustic wave filter and additional circuitry disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes one or more acoustic wave devices that each include a multilayer piezoelectric substrate including a piezoelectric layer and a support substrate below the piezoelectric layer, and an interdigital transducer electrode including a first layer disposed over the piezoelectric layer, a second layer disposed over the first layer, the second layer being of a less dense material than the first layer, and a pair of strips adjacent the second layer and extending over one or more fingers of the interdigital transducer electrode and having a density configured to suppress a transverse mode of the acoustic wave device.

In accordance with another aspect of the disclosure, a method of manufacturing an acoustic wave device is provided. The method comprises forming or providing a multilayer piezoelectric substrate including forming or providing a piezoelectric layer and forming or providing a support substrate below the piezoelectric layer. The method also comprises forming or providing an interdigital transducer electrode including forming or providing a first layer disposed over the piezoelectric layer, forming or providing a second layer disposed over the first layer, the second layer being of a less dense material than the first layer, forming or providing a third layer disposed over the second layer, and etching the third layer to form a pair of strips extending over one or more fingers of the interdigital transducer electrode and having a density configured to suppress a transverse mode of the acoustic wave device.

In accordance with another aspect of the disclosure, a method of manufacturing a radio frequency module is provided. The method comprises forming or providing a package substrate. The method comprises forming or providing an acoustic wave resonator including forming or providing a multilayer piezoelectric substrate including forming or providing a piezoelectric layer and forming or providing a support substrate below the piezoelectric layer, and forming or providing an interdigital transducer electrode including forming or providing a first layer disposed over the piezoelectric layer, forming or providing a second layer disposed over the first layer, the second layer being of a less dense material than the first layer, forming or providing a third layer disposed over the second layer, and etching the third layer to form a pair of strips extending over one or more fingers of the interdigital transducer electrode and having a density configured to suppress a transverse mode of the acoustic wave resonator. The method also comprises attaching additional circuitry and the acoustic wave resonator to the package substrate.

BRIEF DESCRIPTION OF THE DRAWINGS

Embodiments of this disclosure will now be described, by way of non-limiting example, with reference to the accompanying drawings.

DETAILED DESCRIPTION

Figure 1A:
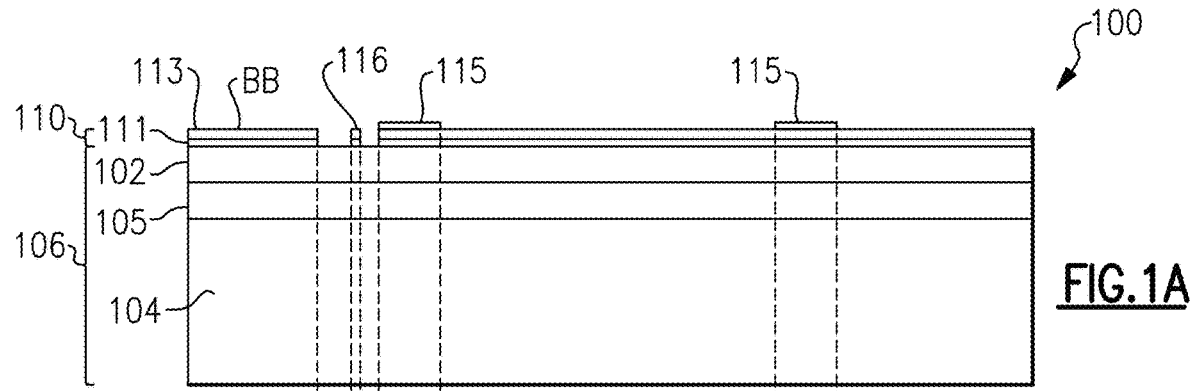
FIG. 1A illustrates a cross-section of a surface acoustic wave (SAW) device including a multi-layer interdigital transducer electrode.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) resonators or devices. The speed at which an acoustic wave will propagate within a SAW resonator is a function of a variety of factors, including the thicknesses of the various components and the density of the materials used to form the various components.

A plurality of resonators may be formed on a single wafer, including filter components of different types. For example, a single wafer may include one or more multi-mode SAW filters, in addition to one or more SAW resonators. These components may have different design, but may share common manufacturing steps, and may therefore share common constituent layers. The use of thicker layers and/or denser materials in an interdigital transducer (IDT) electrode of a SAW resonator can slow the propagation of acoustic waves within the SAW resonators, allowing the SAW resonators to be made more compact. However, the use of these thicker layers or denser materials in IDT electrodes may not be suitable for use in the longitude coupled multi-mode SAW filters.

Aspects of this disclosure relate to the reduction in transverse mode in a SAW device by vertically mass loading portions of the IDT, including partially removing a top high density material layer from the IDT to create high density metal fingers on top of the IDT structure.

Figure 1B:
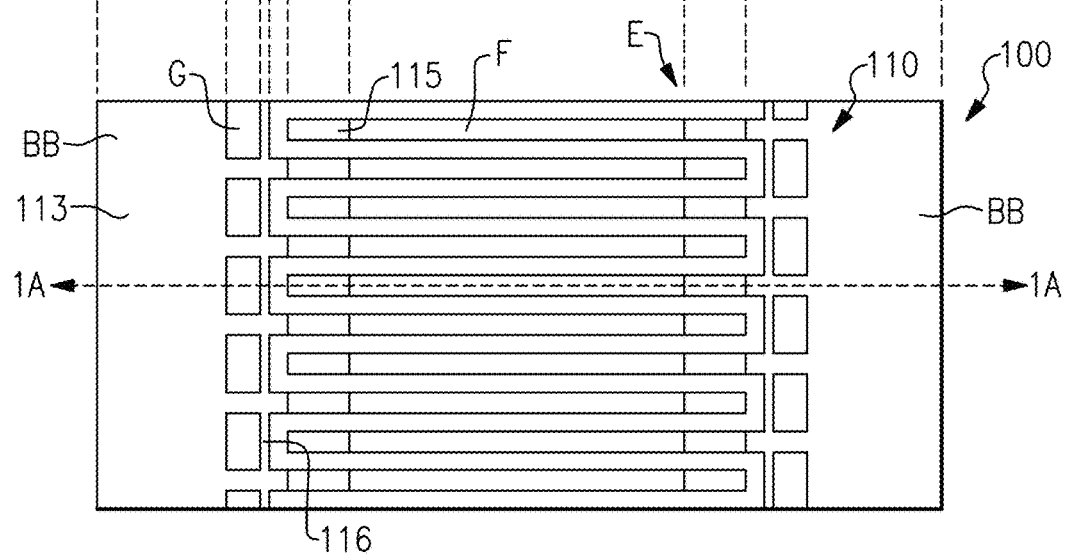
FIG. 1B is a top plan view of the surface acoustic wave device of FIG. 1A.

FIG. 1A illustrates a cross-section of a surface acoustic wave (SAW) resonator or device 100 including a multilayer interdigital transducer electrode (IDT). FIG. 1B is a top plan view of the surface acoustic wave resonator 100 of FIG. 1A. The illustrated SAW resonator or device 100 in includes a piezoelectric layer 102. In some embodiments, the piezoelectric layer 102 may include a material such as lithium tantalate (LT) or lithium niobate (LN), although other suitable materials may also be used.

The SAW resonator or device 100 includes a multilayer piezoelectric substrate 106, including a support substrate 104 and an additional layer 105 (e.g., functional layer) in addition to the piezoelectric layer 102, with the additional layer 105 interposed between the support substrate 104 and the piezoelectric layer 102. The support substrate 104 may include silicon (Si) in some embodiments, although other suitable materials with high acoustic impedance may also be used, including but not limited to sapphire, aluminum oxide ($Al_2O_3$), aluminum nitride (AlN), quartz or ceramic materials. Although the multilayer piezoelectric substrate 106 is illustrated as including three layers, in other implementations (e.g., where quartz is used as the support substrate 104), the multilayer piezoelectric substrate 106 can instead have two layers.

The additional layer 105 (e.g., functional layer) can be a low impedance layer that has a lower acoustic impedance than the support substrate 104. In some implementations, the additional layer 105 can include a silicon dioxide ($SiO_2$) layer. The additional layer 105 can increase adhesion between the support substrate 104 and the piezoelectric layer 102 of the multilayer piezoelectric substrate 106. Alternatively or additionally, the additional layer 105 can increase heat dissipation or temperature compensation in the SAW device 100 relative to a SAW device without the additional layer 105.

The SAW resonator 100 also includes an interdigital transducer (IDT) electrode 110. The IDT electrode 110 can include any suitable IDT electrode material. In the illustrated embodiment, the IDT electrode 110 is a multi-layer IDT electrode that includes separate IDT electrode layers that impact acoustic properties (e.g., IDT layer with more dense material, such as tungsten (W) or molybdenum (Mo)) and electrical properties (e.g., IDT layer with less dense material, such as Aluminum (Al)), respectively. The IDT electrode 110 includes a first IDT layer 111 and a second IDT layer 113 disposed over the first IDT layer 111, with the first IDT layer 111 between the piezoelectric layer 102 and the second IDT layer 113. In some embodiments the first IDT layer 111 can be of a material with a higher density than the material of the second IDT layer 113. Advantageously, the first IDT layer 111 has a density that allows the IDT electrode 110 to provide effective mass loading to increase a reflective coefficient and slow down a velocity of acoustic wave propagation, allowing for a reduction in size of the IDT electrode 110. The second IDT layer 113 advantageously has a density that reduces resistive loss. In some embodiments, the first IDT layer 111 may include molybdenum (Mo) and the second IDT layer 113 may include Aluminum (Al). Other suitable materials can be used for the first IDT layer 111 and/or second IDT layer 113, such as Aluminum (Al) copper (Cu), Magnesium (Mg), tungsten (W), titanium (Ti), Platinum (Pt), Ruthenium (Ru) or other suitable materials, as well as any suitable combination thereof. In some embodiments, the IDT electrode 110 may include alloys, such as AlMgCu, AlCu, etc.

As shown in FIGS. 1A-1B, strips 115 are located over edge regions of the IDT electrode 110 (e.g., adjacent or in contact with the second IDT layer 113). The strips 115 can be mass loading strips (e.g., metal strips, such as high density metal strips) formed by removing a portion of a third layer above the second IDT layer 113). Advantageously, the strips 115 can excite a piston mode operation and reduce transverse mode. In one implementation, the strips 115 can be made of molybdenum (Mo). In another implementation, the strips 115 can be made of Aluminum (Al). In still another implementation, the strips 115 can be made of tungsten (W). In one example, strips 115 are of a different material (e.g., molybdenum (Mo)) than the material of the second IDT layer 113 (e.g., Aluminum (Al)) underneath the strips 115. Because different materials have different etching rates (e.g., the etching rates of molybdenum and aluminum are different), the use of the strips 115 also provide a manufacturing advantage as the second IDT layer 113 can serve as a stop layer when etching a top metal layer of the IDT to form the strips 115. Because of differences in density, strips 115 made of aluminum (Al) would need to have a thickness that is twice to four times the thickness of the strips 115 if they were made of molybdenum (Mo) to provide the same mass loading effect (e.g., because aluminum is less thence than molybdenum). Similarly, if the strips 115 are made of tungsten (W), the strips 115 could be smaller than the thickness of the strips 115 if they were made of molybdenum (Mo) to provide the same mass loading effect (e.g., because tungsten is more dense than molybdenum).

The IDT electrode 110 can include a bus bar BB and fingers F that extend from the bus bar BB toward the opposite bus bar BB, with a gap portion or region G located between the ends of the fingers F and the opposite bus bar BB. In some embodiments the gap portions G may have a width of about 0.9λ, although other suitable widths may also be used. The fingers F of the IDT electrode 110 have an active region. The active region can be a region between the gap portions G. This region can be referred to as an aperture. The edge portions E on either side of a central region of the active region or aperture may have a width of about 0.5 to 1.5λ, although other suitable widths may also be used. The strips 115 can overlie edge portions of fingers F of the IDT electrode 110 as illustrated, and can optionally have the same width as the edge portions E.

With continued reference to FIG. 1A, the SAW device 100 includes the second busbar 116. In the illustrated embodiment, the second busbar 116 is a defined by first IDT layer 111 and second IDT layer 113 disposed over the first IDT layer 111. The second busbar 116 can be smaller than the busbar BB and spaced from ends of the fingers F of the IDT electrode 110.

Figure 2:
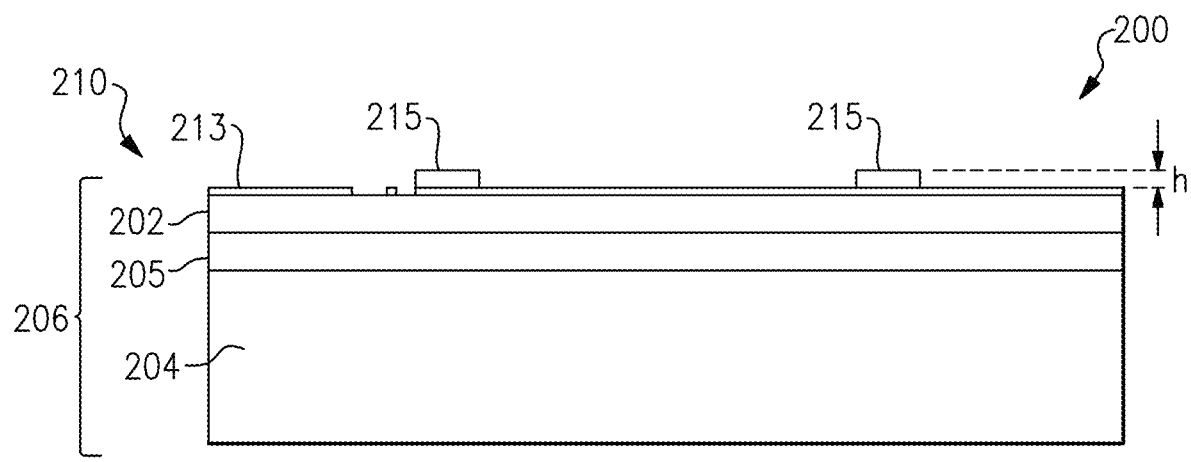
FIG. 2 illustrates a cross-section of a surface acoustic wave (SAW) device including a multi-layer interdigital transducer electrode.

FIG. 2 illustrates a cross-section of a surface acoustic wave (SAW) resonator or device 200 including a multilayer interdigital transducer electrode. The illustrated SAW resonator or device 200 is similar to the SAW resonator or device 100 in FIGS. 1A-1B. Thus, reference numerals used to designate the various components of the SAW resonator 200 are identical to those used for identifying the corresponding components of the SAW resonator 100 in FIGS. 1A-1B, except that the reference numerals begin with a "2" instead of a "1" (e.g., 200 instead of 100). Accordingly, the structure and description above for the various features of the SAW resonator 100 in FIGS. 1A-1B are understood to also apply to the corresponding features of the SAW resonator 200 in FIG. 2, except as described below.

The SAW resonator 200 differs from the SAW resonator 100 in that the strips 215 are made of molybdenum (Mo) and the IDT electrode 210 includes a layer 213 of aluminum (Al) between the piezoelectric layer 202 and the strips 215 (e.g., there is no other IDT layer below the layer 213). The strips 215 have a thickness h above the layer 213 and a width of 0.5λ, or 0.5 L. Additionally, the piezoelectric layer 202 is made of lithium tantalate (LT) and the additional layer 205 below the piezoelectric layer 202 is made of silicon dioxide (SiO2).

Figure 3:
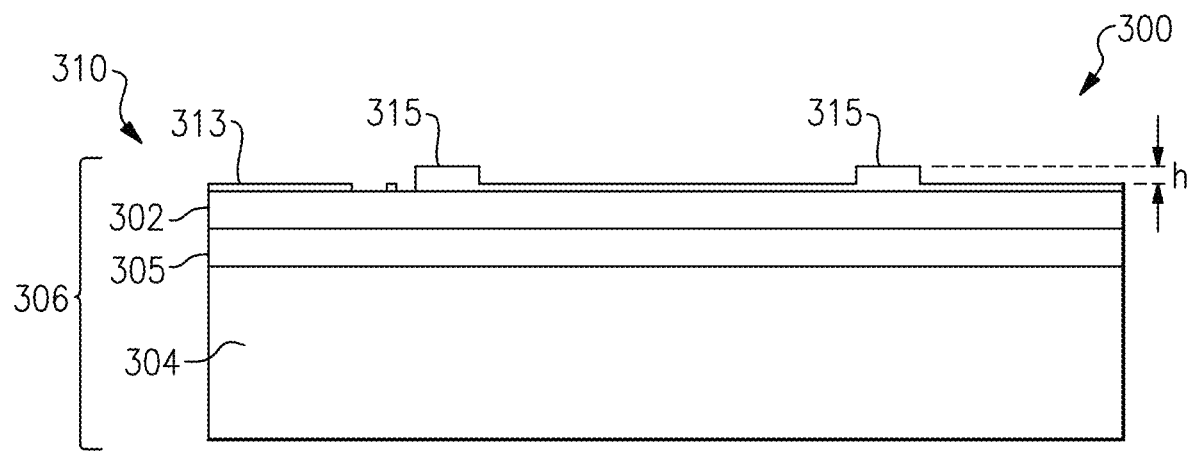
FIG. 3 illustrates a cross-section of a surface acoustic wave (SAW) device including a multi-layer interdigital transducer electrode.

FIG. 3 illustrates a cross-section of a surface acoustic wave (SAW) resonator or device 300 including a multilayer interdigital transducer electrode. The illustrated SAW resonator or device 300 is similar to the SAW resonator or device 100 in FIGS. 1A-1B. Thus, reference numerals used to designate the various components of the SAW resonator 300 are identical to those used for identifying the corresponding components of the SAW resonator 100 in FIGS. 1A-1B, except that the reference numerals begin with a "3" instead of a "1" (e.g., 300 instead of 100). Accordingly, the structure and description above for the various features of the SAW resonator 100 in FIGS. 1A-1B are understood to also apply to the corresponding features of the SAW resonator 300 in FIG. 3, except as described below.

The SAW resonator 300 differs from the SAW resonator 100 in that the strips 315 are made of aluminum (Al) and the IDT electrode 310 includes a layer 313 of aluminum (Al) between the piezoelectric layer 302 and the strips 315 (e.g., there is no other IDT layer below the layer 313). The strips 315 have a thickness h above the layer 313 and a width of 0.5λ, or 0.5 L. Additionally, the piezoelectric layer 302 is made of lithium tantalate (LT) and the additional layer 305 below the piezoelectric layer 302 is made of silicon dioxide (SiO2).

Figure 4:
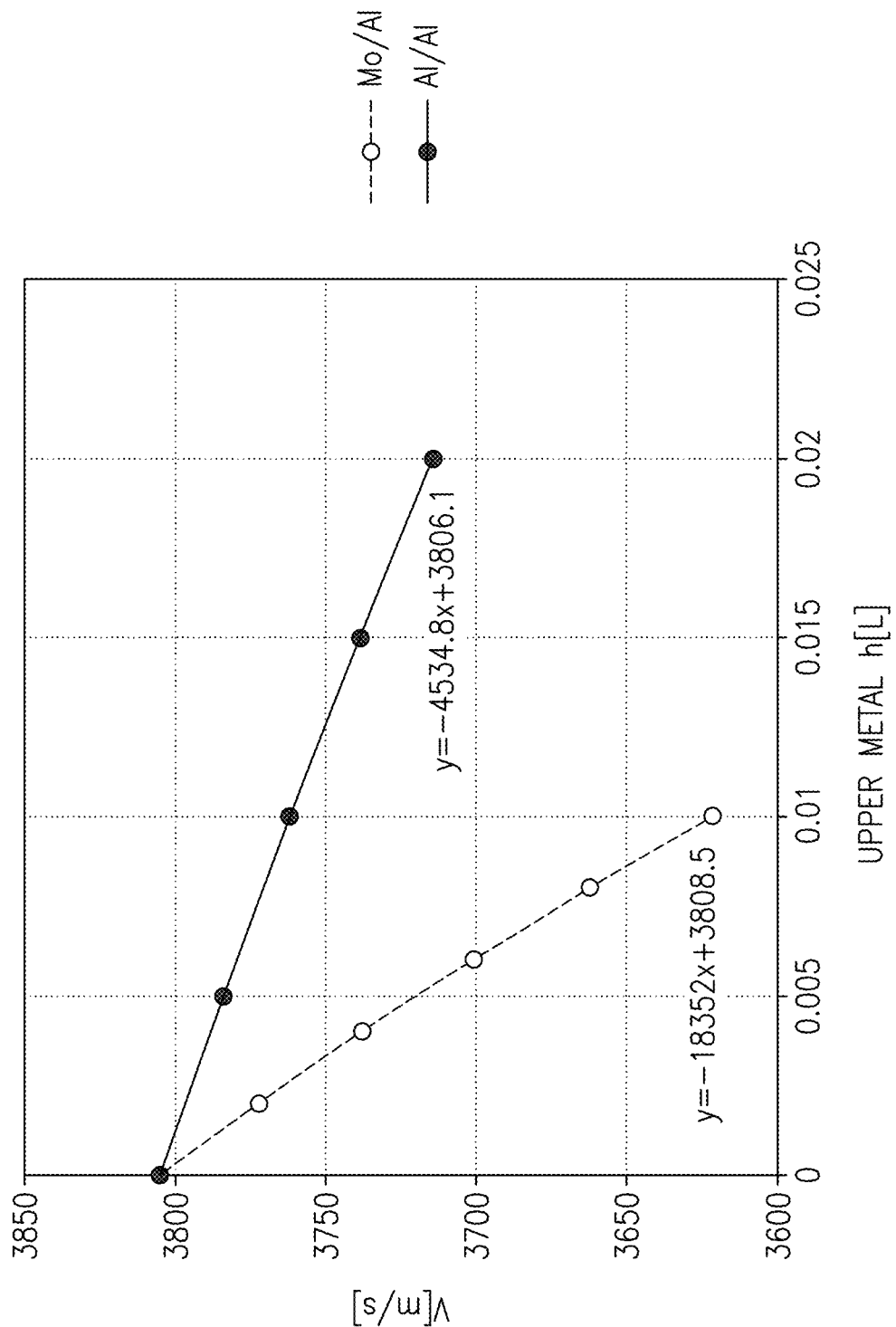
FIG. 4 is a graph of acoustic wave velocity versus thickness of mass loading metal layer in IDT.

FIG. 4 shows a graph of acoustic wave velocity versus thickness (as a function of wavelength λ, or L) of a mass loading metal layer (e.g., strips 215, 315) in IDT electrodes 210 and 310 in FIGS. 2-3. The graph shows that having the strips 215 made of molybdenum (Mo) requires the thickness h of the strips 215 to be smaller (e.g., about $\frac{1}{4}^{th}$) than the thickness h of the strips 315 made of Aluminum (Al) to provide the same acoustic wave velocity performance. For example, to obtain a 50 m/s change in acoustic wave velocity, the thickness h of the strips 215 of molybdenum (Mo) would need to be 0.0025 L, while the thickness h of the strips 315 of Aluminum (Al) would need to be 0.01 L. The graph shows data points for velocity (in m/s) versus thickness h(L) of the strips 215, 315, and line approximations defined by the functions shown.

Figure 5A:
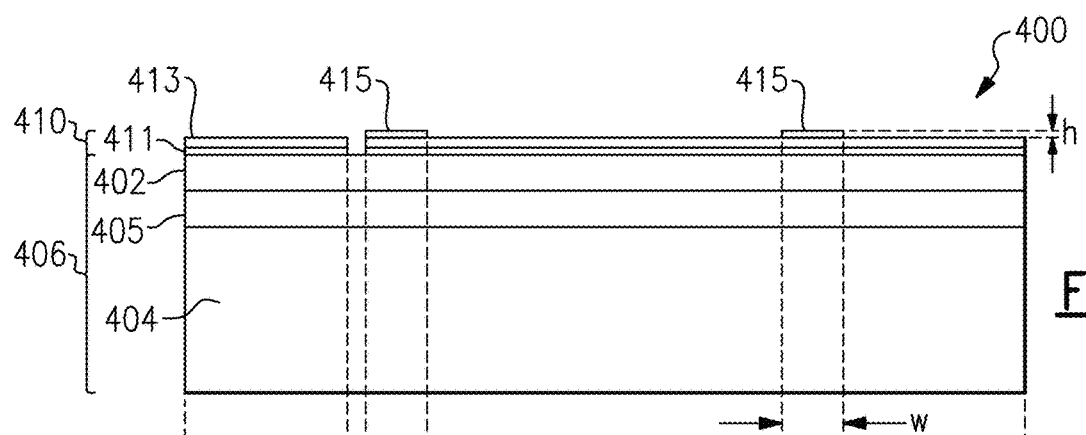
FIG. 5A illustrates a cross-section of a surface acoustic wave (SAW) device including a multi-layer interdigital transducer electrode.
Figure 5B:
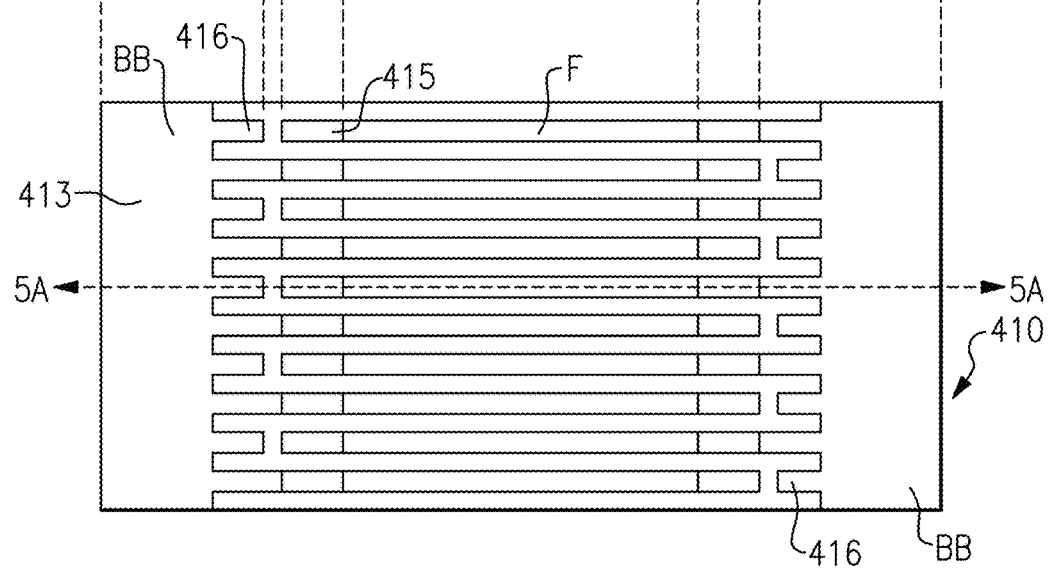
FIG. 5B is a top plan view of the surface acoustic wave device of FIG. 5A.

FIG. 5A illustrates a cross-section of a surface acoustic wave (SAW) resonator or device 400 including a multilayer interdigital transducer electrode. FIG. 5B is a top plan view of the surface acoustic wave resonator 400 of FIG. 5A. The illustrated SAW resonator or device 400 is similar to the SAW resonator or device 100 in FIGS. 1A-1B. Thus, reference numerals used to designate the various components of the SAW resonator 400 are identical to those used for identifying the corresponding components of the SAW resonator 100 in FIGS. 1A-1B, except that the reference numerals begin with a "4" instead of a "1" (e.g., 400 instead of 100). Accordingly, the structure and description above for the various features of the SAW resonator 100 in FIGS. 1A-1B are understood to also apply to the corresponding features of the SAW resonator 400 in FIGS. 5A-5B, except as described below.

The SAW resonator 400 differs from the SAW resonator 100 in that the SAW resonator 400 has busbars BB that include extension portions, such as extension portion 416, in the gap region that are spaced from end portions of fingers F of the IDT electrode 410. The extension portions 416 can be dummy electrodes. As shown in FIG. 5A, the extension portions 416 are formed by the first IDT layer 411 and the second IDT layer 413. The SAW resonator 400 also differs from the SAW resonator 100 in that it does not include a second busbar (e.g., like the second busbar 116 in FIGS. 1A-1B). The (mass loading) strips 415 have a width w. In the illustrated implementation, the width w is 0.75λ, or 0.75 L. Additionally, in the illustrated implementation, the first IDT layer 411 is made of molybdenum (Mo) having a thickness of 0.02λ or 0.02 L and the second IDT layer 413 is made of Aluminum (Al) having a thickness of 0.08λ, or 0.08 L.

Figure 6:
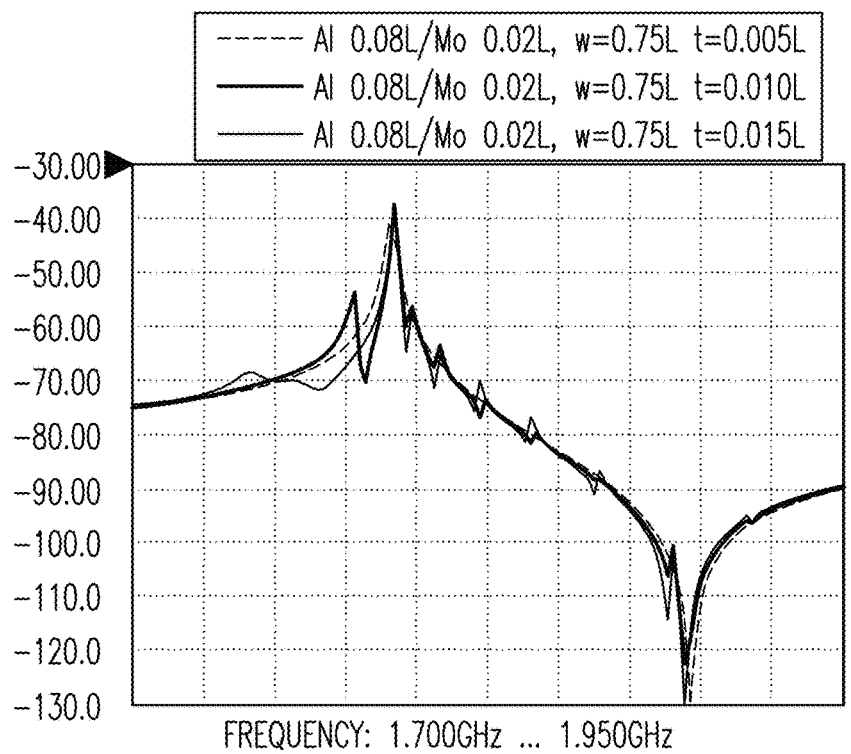
FIG. 6 is a graph of the effect of a thickness of the mass loading layer on the frequency response of an acoustic wave device.
Figure 7:
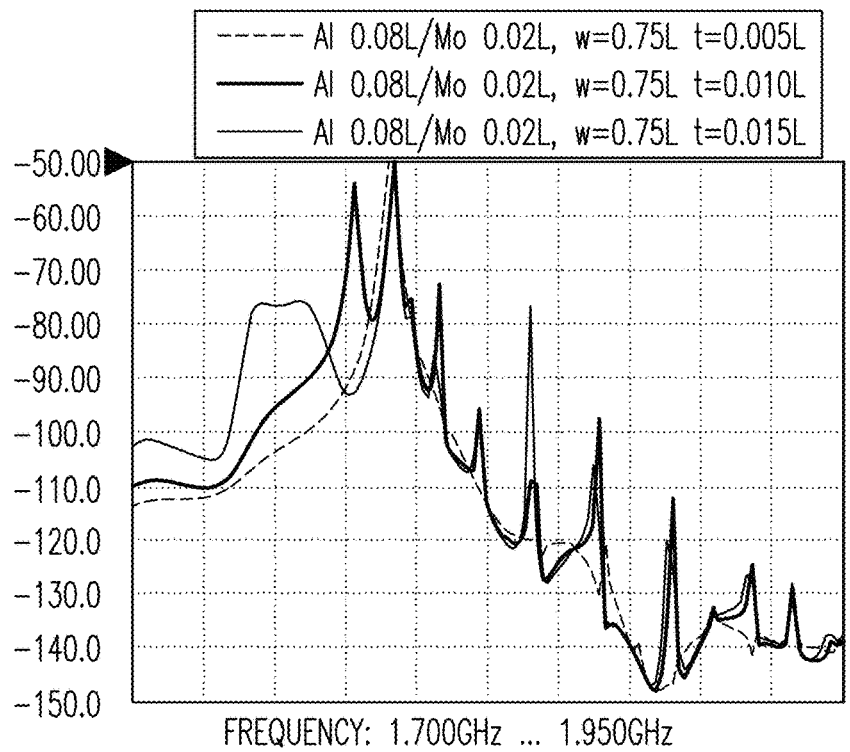
FIG. 7 is a graph of the effect of a thickness of the mass loading layer on the frequency response of an acoustic wave device.
Figure 8:
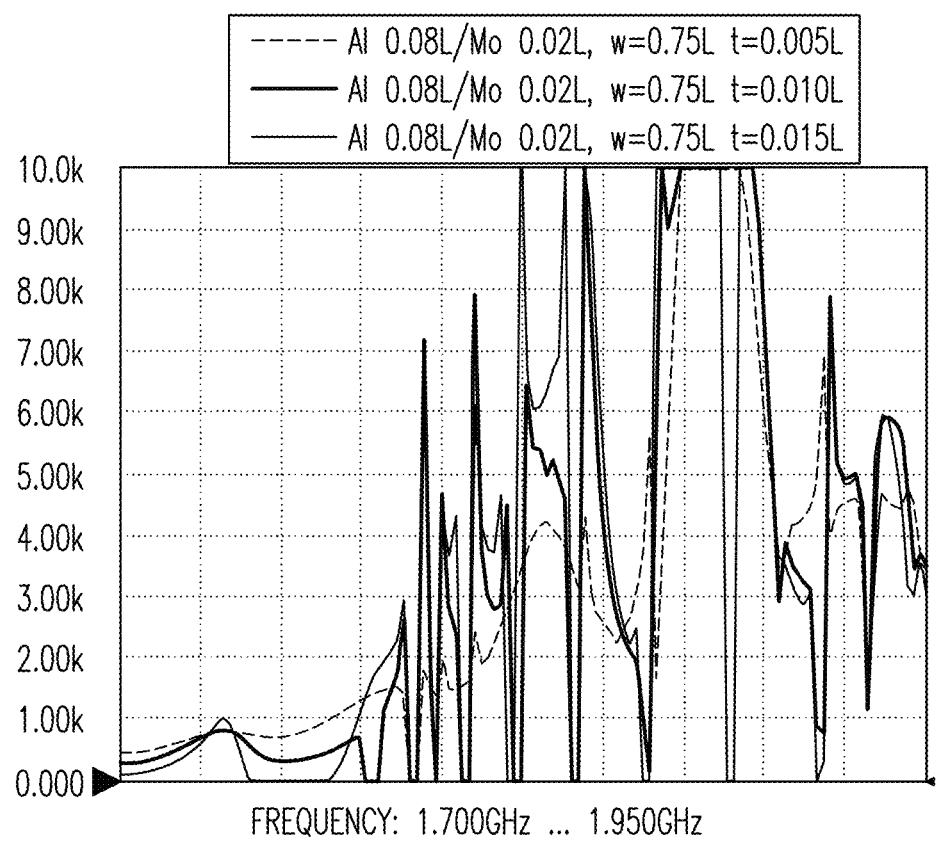
FIG. 8 is a graph of the effect of a thickness of the mass loading layer on the frequency response of an acoustic wave device.

FIGS. 6-8 are graphs of the effect of a thickness h of the mass loading layer (e.g., strips 415) on the frequency response of the acoustic wave device or SAW resonator 400. The graphs compare the performance of the SAW resonator 400 where the strips 415 have a thickness h of 0.005λ or 0.005 L, a thickness h of 0.010λ or 0.010 L, and a thickness h of 0.015λ or 0.015 L. The graphs indicate that, of the three, the SAW resonator 400 with the strips 415 having a thickness h of 0.005λ, or 0.005 L has the best performance, almost suppressing transverse mode. In contrast, the SAW resonator 400 with the other two thicknesses for the strips 415 (e.g., 0.010 L or 0.015 L) show strong transverse mode performance and leakage between the resonant and antiresonant frequency.

Figure 9:
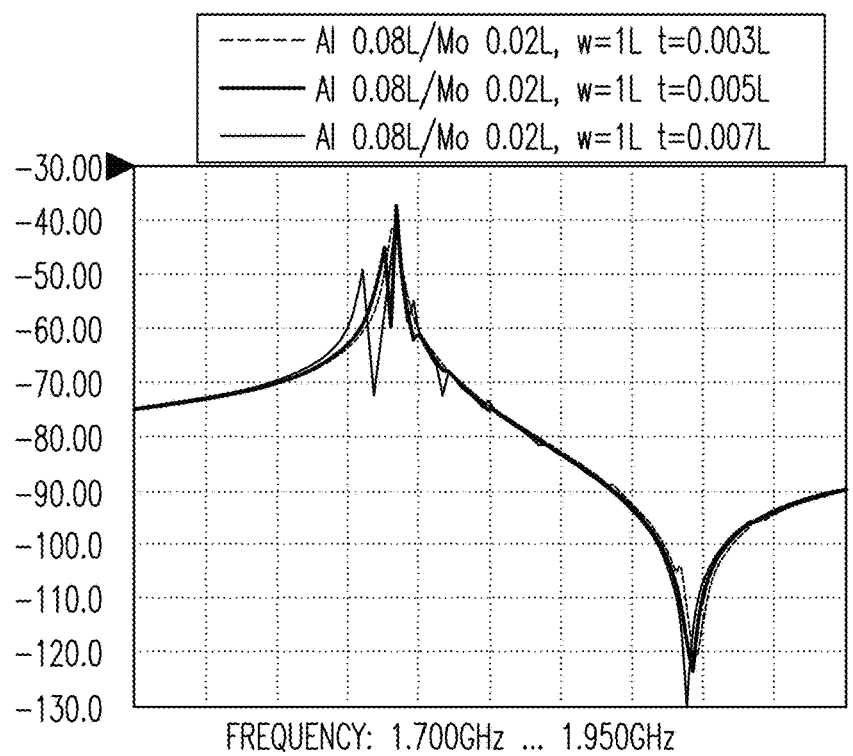
FIG. 9 is a graph of the effect of a thickness of the mass loading layer having a greater finger width on the frequency response of an acoustic wave device.
Figure 10:
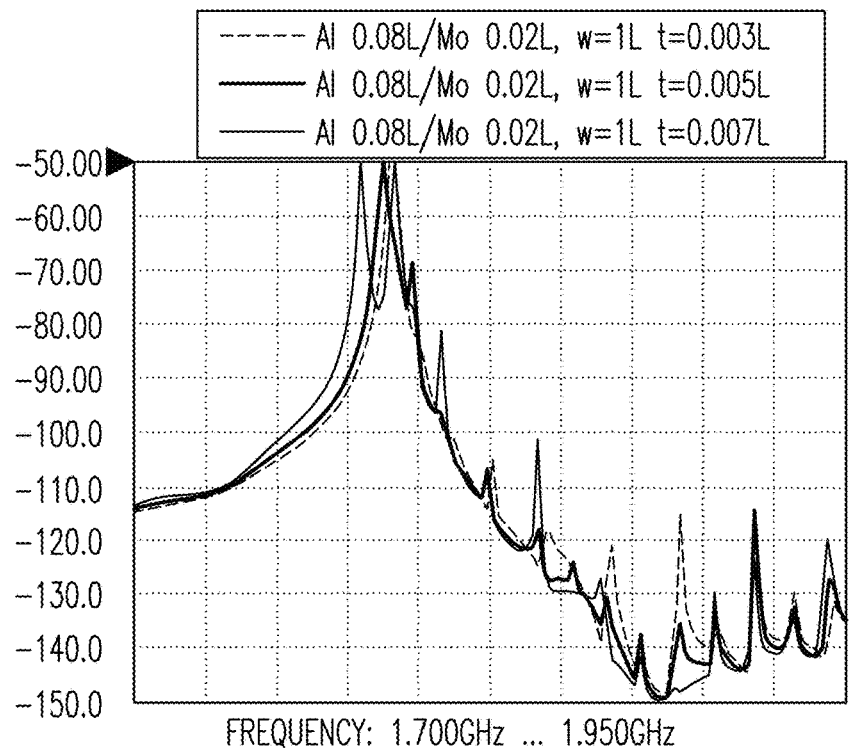
FIG. 10 is a graph of the effect of a thickness of the mass loading layer having a greater finger width on the frequency response of an acoustic wave device.
Figure 11:
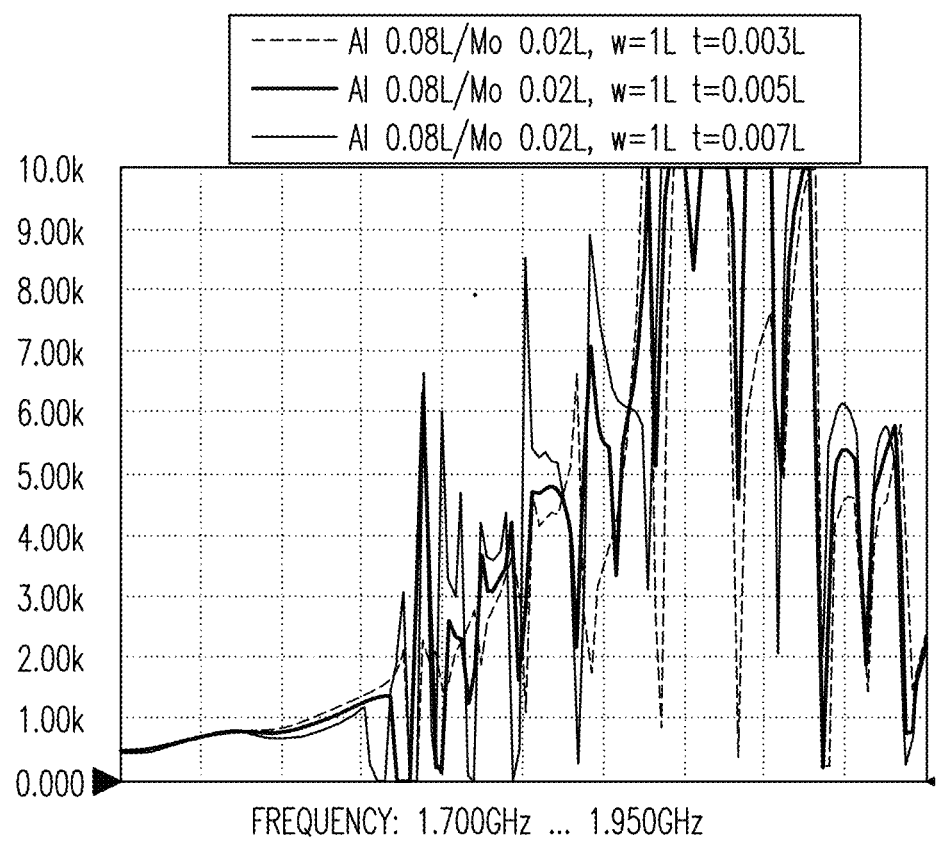
FIG. 11 is a graph of the effect of a thickness of the mass loading layer having a greater finger width on the frequency response of an acoustic wave device.

FIGS. 9-11 are graphs of the effect of a thickness of the mass loading layer on the frequency response of an acoustic wave device identical to the SAW resonator 400 in FIGS. 5A-5B, except having a width w of 1λ, or 1 L for the strips 415. The graphs compare the performance of the SAW resonator 400 where the strips 415 have a width of 1λ or 1 L and thickness h of 0.003λ, or 0.003 L, a thickness h of 0.005λ, or 0.005 L, or a thickness h of 0.007λ, or 0.007 L. The graphs indicate that, of the three, the SAW resonator 400 with the strips 415 having a width w of 1λ or 1 L and a thickness h of 0.003λ, or 0.003 L has the best performance, almost suppressing transverse mode. In contrast, the SAW resonator 400 with the other two thicknesses for the strips 415 (e.g., 0.005 L or 0.007 L) show worse transverse mode performance and leakage between the resonant and antiresonant frequency. Advantageously, the SAW resonator 400 with the strips 415 having a width w of 1λ, or 1 L and a thickness h of 0.003λ, or 0.003 L has a better Q than the SAW resonator 400 with a width w of 0.75λ, or 0.075 L shown in FIGS. 6-8. In some implementations, the strips 415 can have a width of between 0.5 L and 1.5 L (e.g., a width of 0.5 L, a width of 1.5 L, a width of 1.0 L) and a thickness of between 0.001 L and 0.005 L (e.g., a thickness of 0.001 L, a thickness of 0.005 L, a thickness of 0.003 L).

Figure 12:
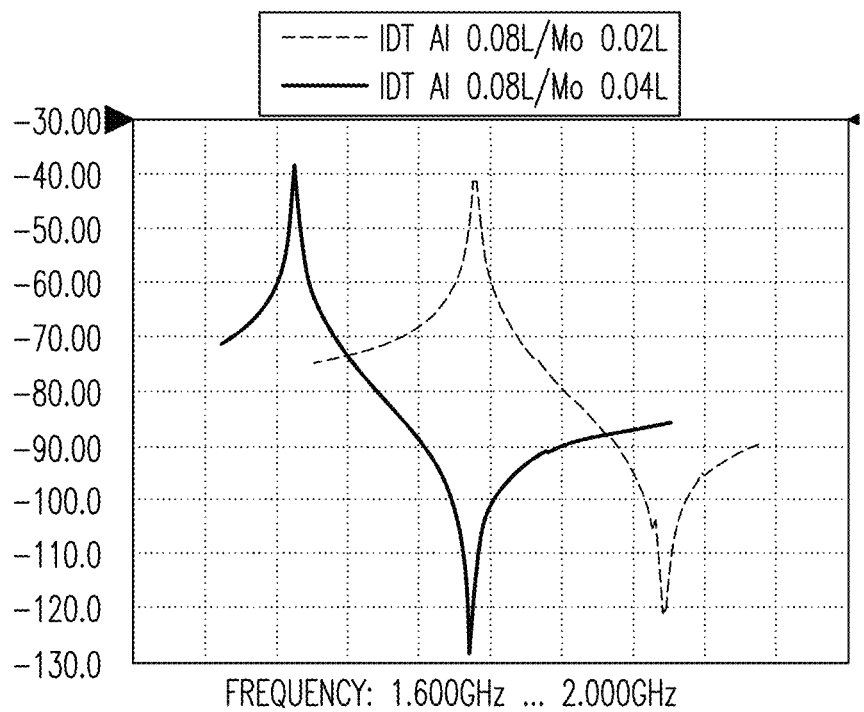
FIG. 12 is a graph of the effect of a thickness of a dense metal layer in the IDT on acoustic wave velocity.
Figure 13:
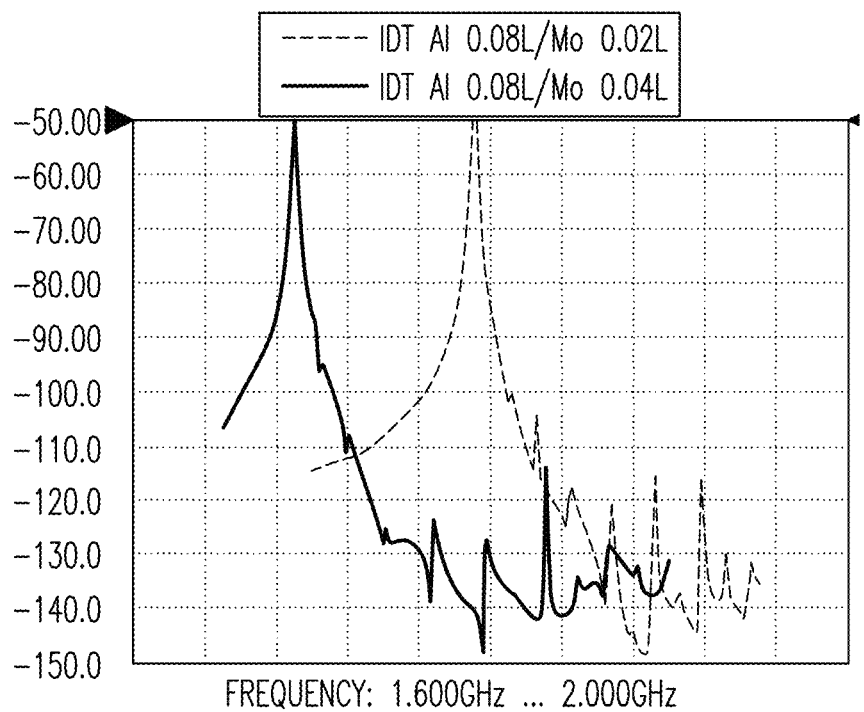
FIG. 13 is a graph of the effect of a thickness of a dense metal layer in the IDT on acoustic wave velocity.
Figure 14:
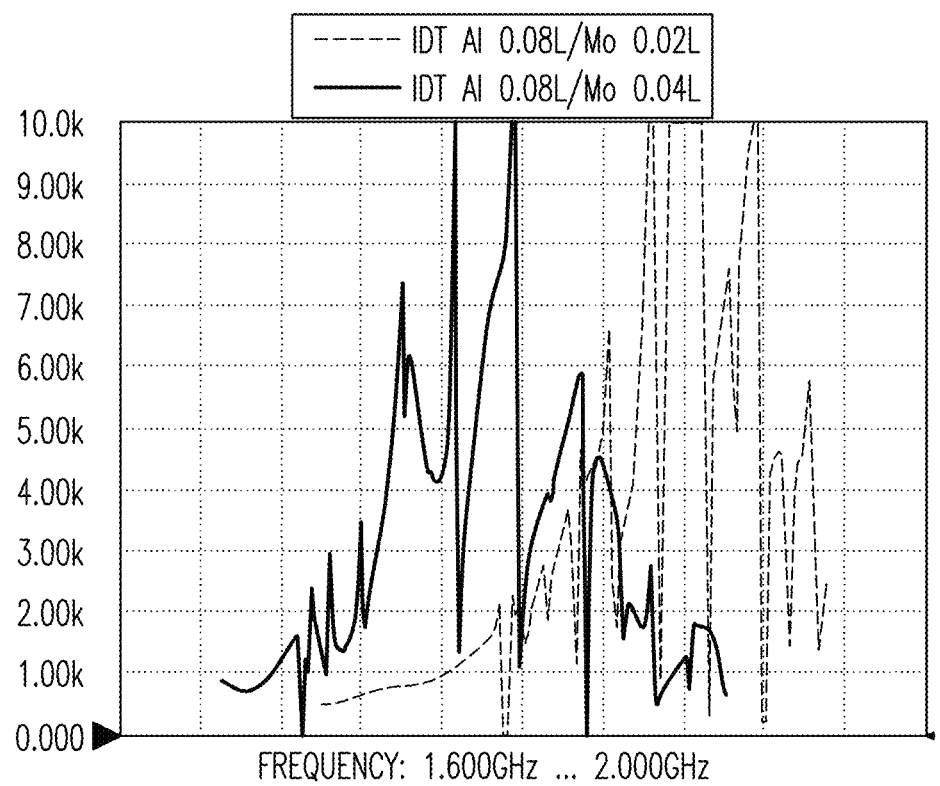
FIG. 14 is a graph of is a graph of the effect of a thickness of a dense metal layer in the IDT on acoustic wave velocity.

FIGS. 12-14 show graphs of the effect of a thickness of a dense metal layer in the IDT on acoustic wave velocity. In particular, FIGS. 12-14 show the frequency response for an IDT, like IDT electrode 110, 210, 310, 410, having a first layer (e.g., first layer 111, 211, 311, 411) of molybdenum (Mo) with a thickness of 0.02λ, or 0.02 L and a second layer (e.g., second layer 113, 213, 313, 413) of Aluminum (Al) with a thickness of 0.08λ or 0.08 L as compared with an IDT, like IDT electrode 110, 210, 310, 410, having a first layer (e.g., first layer 111, 211, 311, 411) of molybdenum (Mo) with a thickness of 0.04λ or 0.04 L and a second layer (e.g., second layer 113, 215, 313, 413) of Aluminum (Al) with a thickness of 0.08λ or 0.08 L. The graphs show that the IDT with the greater thickness (e.g., 0.04 L) of the first layer (e.g., first layer 111, 211, 311, 411) of molybdenum (Mo) slows down the velocity of the acoustic wave, which can advantageously allow a reduction in the size of the IDT. Therefore, one advantage of using a multilayer IDT, such as the multilayer IDT electrode 110, 210, 310, 410 (or any other disclosed herein) is that the velocity performance can be adjusted by changing the thickness of the first layer (e.g., first layer 111, 211, 311, 411), such as first layer made of molybdenum (Mo).

Figures 15A, 15B:
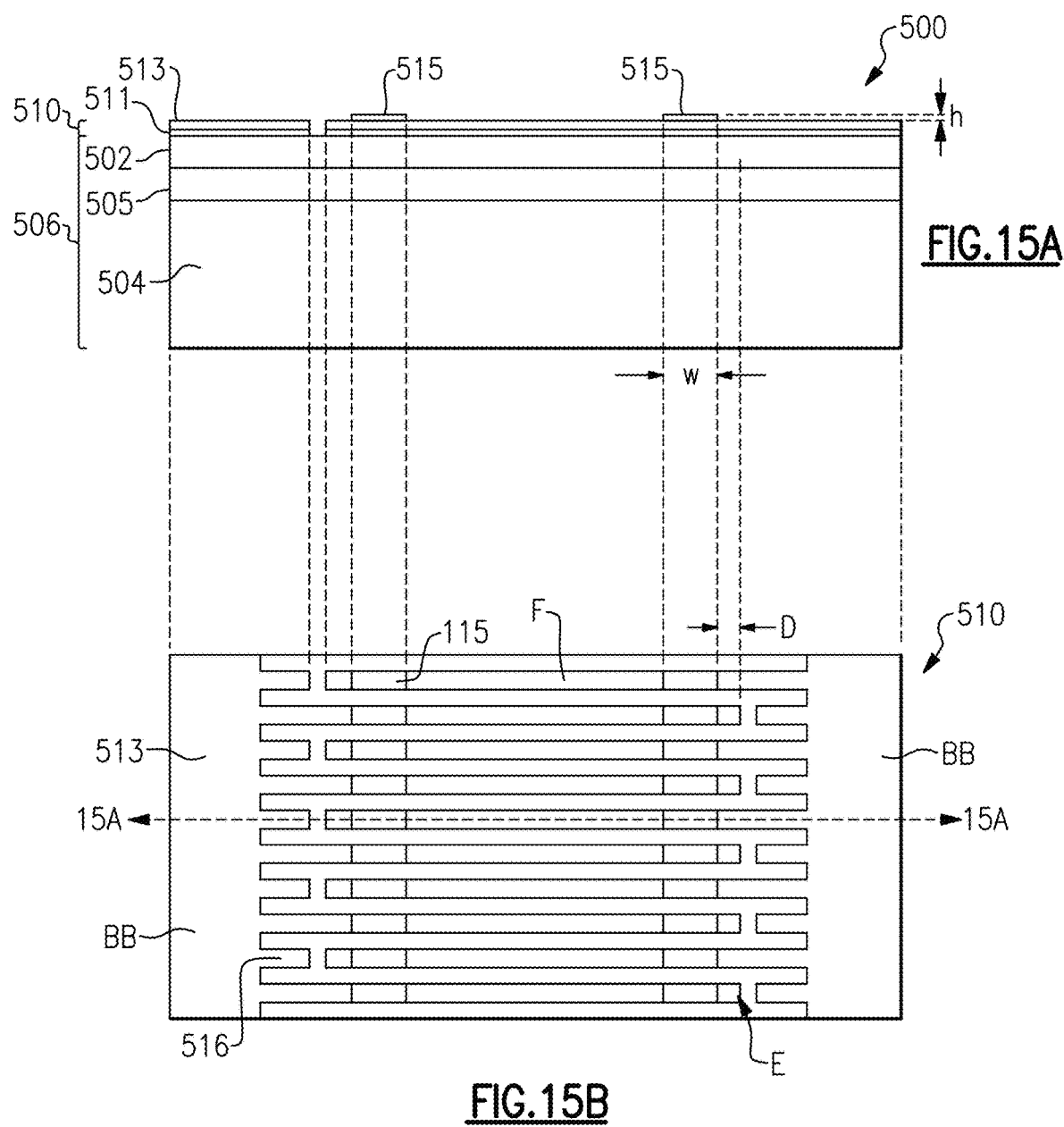
FIG. 15A illustrates a cross-section of a surface acoustic wave (SAW) device including a multi-layer interdigital transducer electrode.
FIG. 15B is a top plan view of the surface acoustic wave device of FIG. 15A.

FIG. 15A illustrates a cross-section of a surface acoustic wave (SAW) resonator or device 500 including a multilayer interdigital transducer electrode. FIG. 15B is a top plan view of the surface acoustic wave resonator or device 500 of FIG. 15A. The illustrated SAW resonator or device 500 is similar to the SAW resonator or device 400 in FIGS. 5A-5B. Thus, reference numerals used to designate the various components of the SAW resonator 500 are identical to those used for identifying the corresponding components of the SAW resonator 400 in FIGS. 5A-5B, except that the reference numerals begin with a "5" instead of a "4" (e.g., 500 instead of 400). Accordingly, the structure and description above for the various features of the SAW resonator 400 in FIGS. 5A-5B, which are based on the structure and description of the SAW resonator 100 in FIGS. 1A-1B, are understood to also apply to the corresponding features of the SAW resonator 500 in FIGS. 15A-15B, except as described below.

The SAW resonator 500 differs from the SAW resonator 400 in that the (mass loading) strips 515 are offset from the edge region E of the fingers F of the IDT electrode 510 (e.g., toward a center region of the finger F) by a distance D. In one implementation, the SAW resonator 500 has an IDT electrode 510 with a first layer 511 of molybdenum (Mo) having a thickness of 0.04λ or 0.04 L and a second layer 513 of Aluminum (Al) having a thickness of 0.08λ or 0.08 L. In one example, the SAW resonator 500 has strips 515 with a width w of 1.0λ, or 1.0 L. In another example, the SAW resonator 500 has (mass loading) strips 515 with a width W of 0.5 k or 0.5 L. In one example, the SAW resonator 500 has strips 515 with a thickness h of 0.005λ, or 0.005 L. In another example, the SAW resonator 500 has (mass loading) strips 515 with a thickness h of 0.007λ, or 0.007 L.

Figure 16:
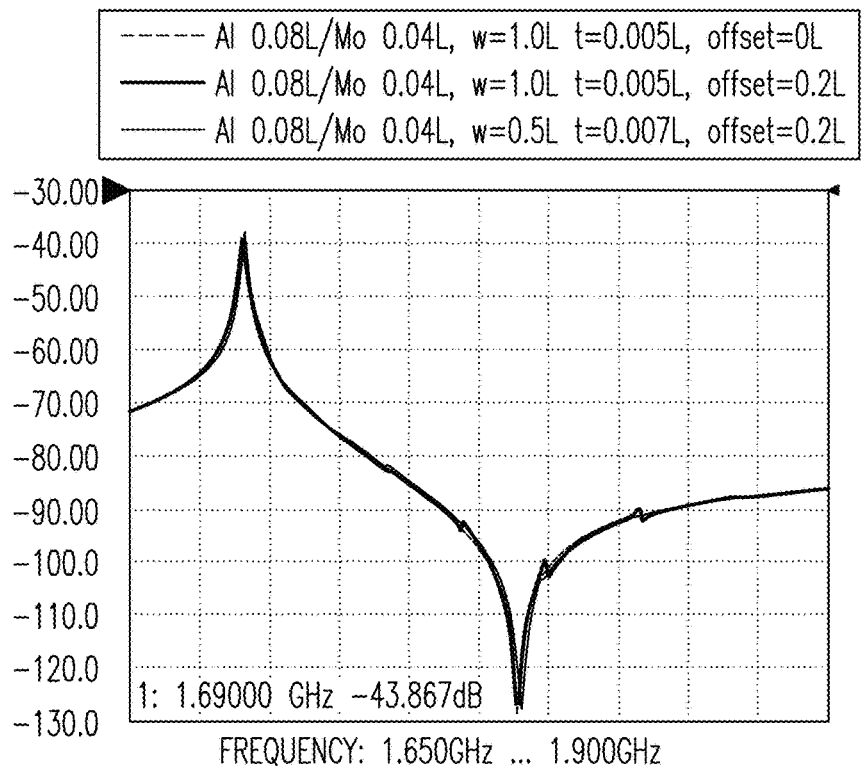
FIG. 16 is a graph of the effect of offsetting a finger of the mass loading layer on the frequency response of an acoustic wave device.
Figure 17:
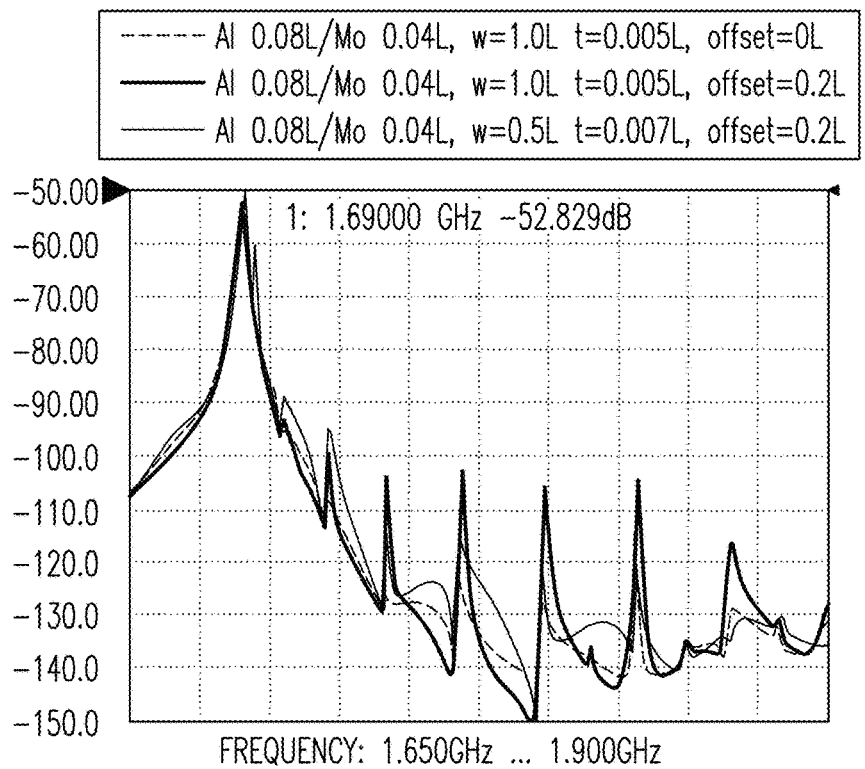
FIG. 17 is a graph of the effect of offsetting a finger of the mass loading layer on the frequency response of an acoustic wave device.
Figure 18:
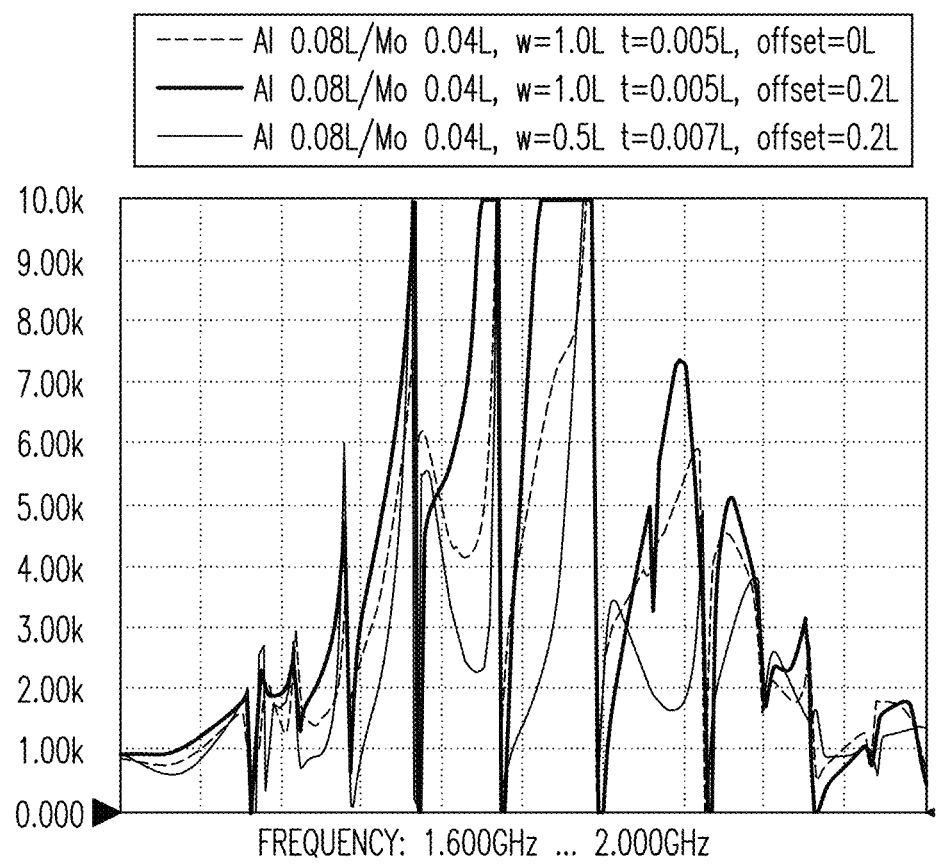
FIG. 18 is a graph of the effect of offsetting a finger of the mass loading layer on the frequency response of an acoustic wave device.

FIGS. 16-18 are graphs of the effect of the offset distance D of the mass loading layer (e.g., strips 515) on the frequency response of the acoustic wave device or SAW resonator 500. The graphs the performance of the SAW resonator 500 where the (mass loading) strips 515 have a width of 1.0λ, or 1.0 L, a thickness h of 0.005λ, or 0.005 L and zero offset (e.g., D=0), compared to the performance of the SAW resonator 500 where the (mass loading) strips 515 have a width of 1.0λ, or 1.0 L, a thickness h of 0.005λ, or 0.005 L and an offset (D) of 0.2λ or 0.2 L, and compared to the performance of the SAW resonator 500 where the (mass loading) strips 515 have a width of 1.0λ, or 1.0 L, a thickness h of 0.007λ, or 0.007 L and an offset (D) of 0.2λ, or 0.2 L. The graphs indicate that the SAW resonator 500 with the offset strips 515 have a better Q performance.

Figure 19:
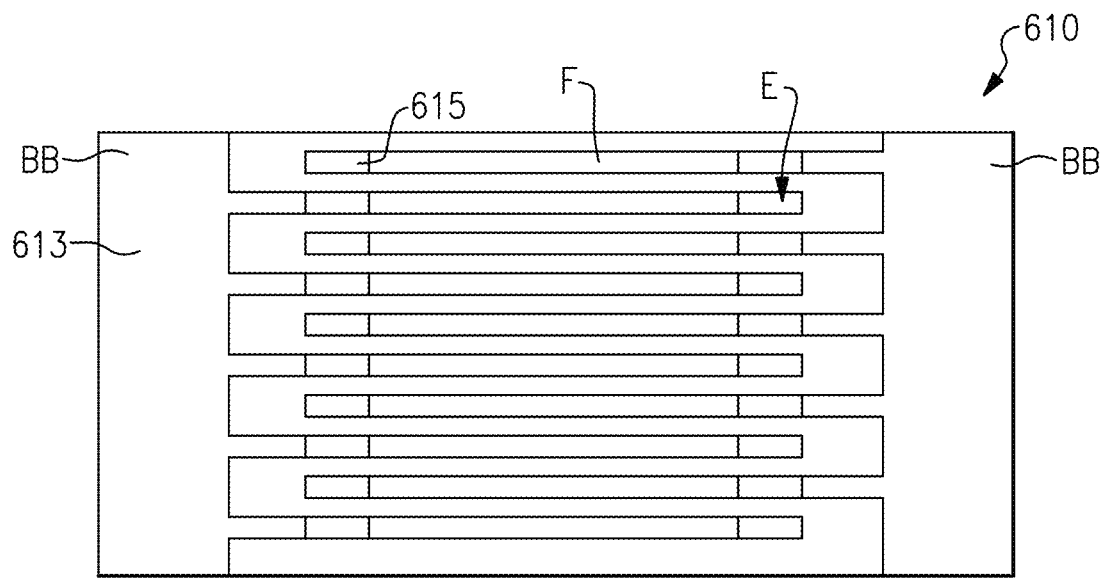
FIG. 19 is a top plan view of a surface acoustic wave device.

FIG. 19 shows a top plan view of an IDT electrode 610 layout that can be implemented on a multilayer piezoelectric substrate (MPS) of a SAW resonator or device, such as the multilayer piezoelectric substrate 106, 206, 306, 406, 506. The IDT electrode 610 has a top layer 613. Though not shown, the IDT electrode 610 can optionally be a multilayer IDT and have a first layer under the top layer 613. As with other implementations disclosed herein, the IDT electrode 610 has (mass loading) strips 615 disposed over the edge region E of the fingers F. Ends of the fingers F are spaced from a busbar BB. In one implementation, the (mass loading) strips 615 can be offset from an end of the edge region E of the fingers F, as discussed further below in connection with FIG. 23.

Figure 20:
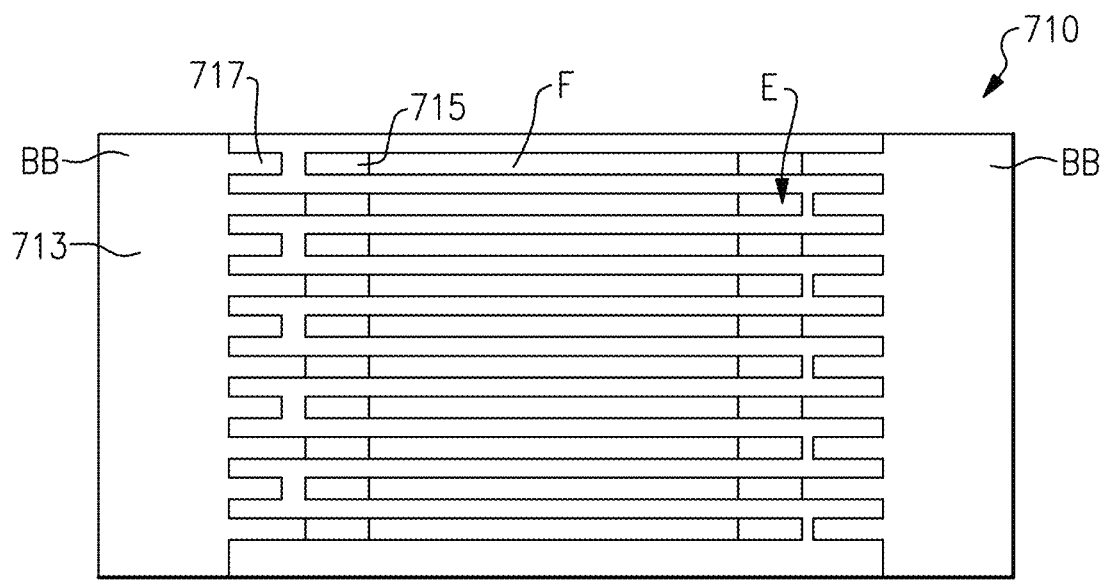
FIG. 20 is a top plan view of a surface acoustic wave device.

FIG. 20 shows a top plan view of an IDT electrode 710 layout that can be implemented on a multilayer piezoelectric substrate (MPS) of a SAW resonator or device, such as the multilayer piezoelectric substrate 106, 206, 306, 406, 506. The IDT electrode 710 has a top layer 713. Though not shown, the IDT electrode 710 can optionally be a multilayer IDT and have a first layer under the top layer 713. As with other implementations disclosed herein, the IDT electrode 710 has (mass loading) strips 715 disposed over the edge region E of the fingers F. The IDT electrode 710 has busbars BB that include extension portions, such as extension portion 717, in the gap region that are spaced from end portions of fingers F of the IDT electrode 710. The extension portions 717 can be dummy electrodes (e.g., dummy IDT electrodes). In one implementation, the (mass loading) strips 715 can be offset from an end of the edge region E of the fingers F, as discussed further below in connection with FIG. 23.

Figure 21:
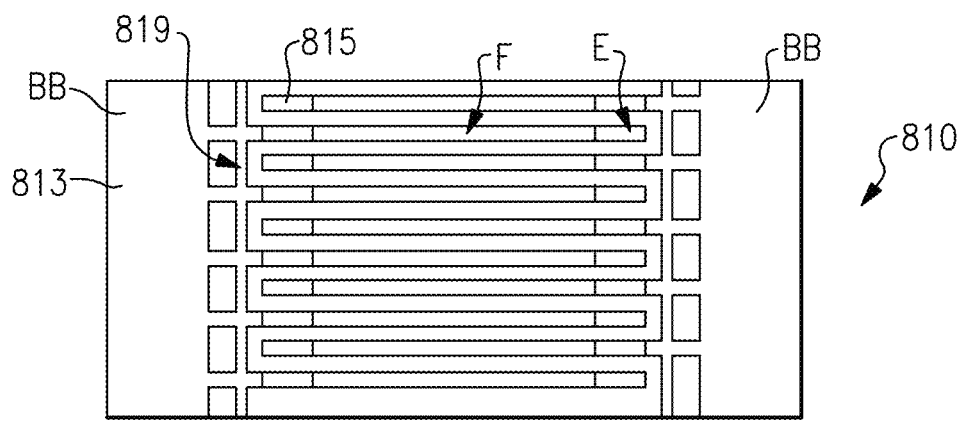
FIG. 21 is a top plan view of a surface acoustic wave device.

FIG. 21 shows a top plan view of an IDT electrode 810 layout that can be implemented on a multilayer piezoelectric substrate (MPS) of a SAW resonator or device, such as the multilayer piezoelectric substrate 106, 206, 306, 406, 506. The IDT electrode 810 has a top layer 813. Though not shown, the IDT electrode 810 can optionally be a multilayer IDT and have a first layer under the top layer 813. As with other implementations disclosed herein, the IDT electrode 810 has (mass loading) strips 815 disposed over the edge region E of the fingers F. The IDT electrode 810 has busbars BB and second busbars 819. The second busbar 819 is a defined by the top (e.g., second) IDT layer 813 (and if a multilayer IDT, disposed over a first IDT layer). The second busbar 819 can be smaller than the busbar BB and spaced from ends of the fingers F of the IDT electrode 810. In one implementation, the (mass loading) strips 815 can be offset from an end of the edge region E of the fingers F, as discussed further below in connection with FIG. 23.

Figure 22:
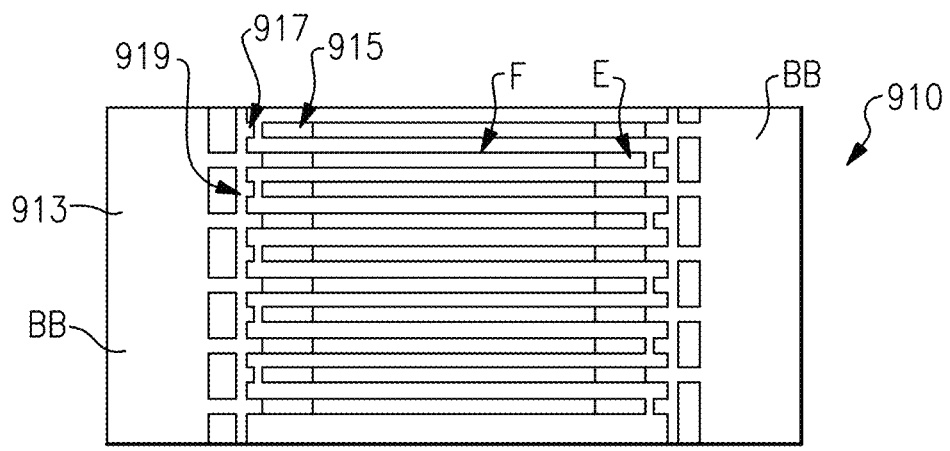
FIG. 22 is a top plan view of a surface acoustic wave device.

FIG. 22 shows a top plan view of an IDT electrode 910 layout that can be implemented on a multilayer piezoelectric substrate (MPS) of a SAW resonator or device, such as the multilayer piezoelectric substrate 106, 206, 306, 406, 506. The IDT electrode 910 has a top layer 913. Though not shown, the IDT electrode 910 can optionally be a multilayer IDT and have a first layer under the top layer 913. As with other implementations disclosed herein, the IDT electrode 910 has (mass loading) strips 915 disposed over the edge region E of the fingers F (e.g., in contact with the top layer 913). The IDT electrode 910 has busbars BB and second busbars 919. The second busbar 919 is a defined by the top (e.g., second) IDT layer 913 (and if a multilayer IDT, disposed over a first IDT layer). The second busbar 919 can be smaller than the busbar BB and spaced from ends of the fingers F of the IDT electrode 910. The second busbars 919 include extension portions, such as extension portion 917, in the gap region that are spaced from end portions of fingers F of the IDT electrode 910. The extension portions 917 can be dummy electrodes (e.g., dummy IDT electrodes). In one implementation, the (mass loading) strips 915 can be offset from an end of the edge region E of the fingers F, as discussed further below in connection with FIG. 23.

Figure 23:
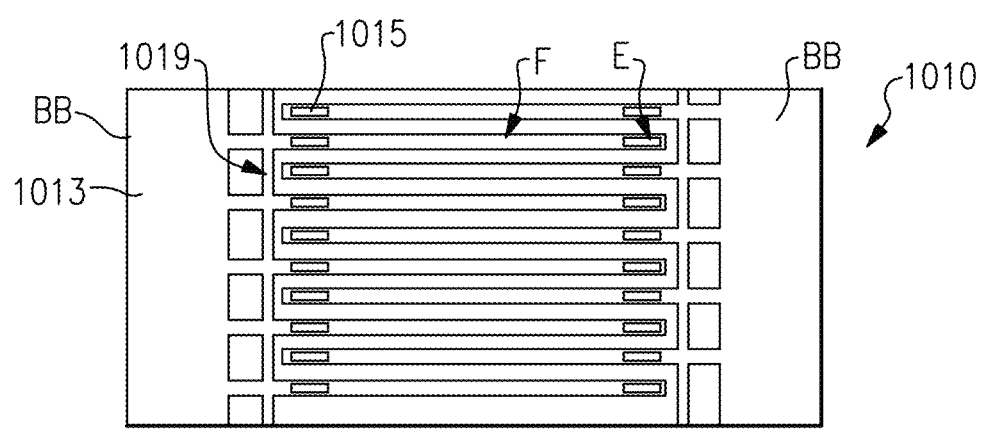
FIG. 23 is a top plan view of a surface acoustic wave device.

FIG. 23 shows a top plan view of an IDT electrode 1010 layout that can be implemented on a multilayer piezoelectric substrate (MPS) of a SAW resonator or device, such as the multilayer piezoelectric substrate 106, 206, 306, 406, 506. The IDT electrode 1010 has a top layer 1013. Though not shown, the IDT electrode 1010 can optionally be a multilayer IDT and have a first layer under the top layer 1013. The IDT electrode 1010 has (mass loading) strips 1015 disposed over the top layer 1013 and offset from an end of the edge region E of the fingers F. The IDT electrode 1010 has busbars BB and second busbars 1019. The second busbar 1019 is a defined by the top (e.g., second) IDT layer 1013 (and if a multilayer IDT, disposed over a first IDT layer). The second busbar 1019 can be smaller than the busbar BB and spaced from ends of the fingers F of the IDT electrode 1010.

Figure 24:
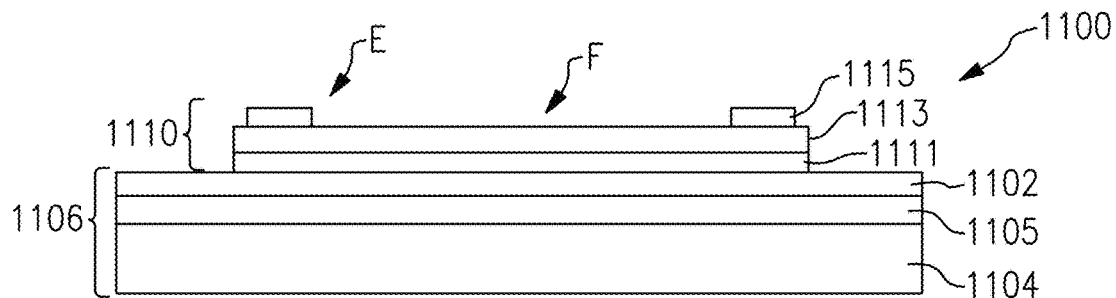
FIG. 24 illustrates a cross-section of a surface acoustic wave (SAW) device including a multi-layer interdigital transducer electrode.

FIG. 24 illustrates a cross-section of a surface acoustic wave (SAW) resonator or device 1100 including a multilayer interdigital transducer electrode 1110. The illustrated SAW resonator or device 1100 is similar to the SAW resonator or device 100 in FIGS. 1A-1B. Thus, reference numerals used to designate the various components of the SAW resonator 1100 are identical to those used for identifying the corresponding components of the SAW resonator 100 in FIGS. 1A-1B, except that the reference numerals begin with an "11" instead of a "1" (e.g., 1100 instead of 100). Accordingly, the structure and description above for the various features of the SAW resonator 100 in FIGS. 1A-1B are understood to also apply to the corresponding features of the SAW resonator 1100 in FIG. 24, except as described below.

The SAW resonator 1100 differs from the SAW resonator 100 in that the IDT layout excludes the busbars (e.g., busbar BB and secondary busbar 116 in FIGS. 1A-1B), which are not shown for clarity. As with other SAW resonators disclosed herein, the (mass loading) strips 1115 can be disposed on the second IDT layer 1113 at the end portion E of the fingers F of the IDT electrode 1110. However, the SAW resonator 1100 can have the same structure as the SAW resonator 100. In one implementation, the first IDT layer 1111 can be made of molybdenum (Mo), the second IDT layer 1113 can be made of Aluminum (Al) and the (mass loading) strips 1115 can be made of molybdenum (Mo). In one implementation, side edges of the second IDT layer 1113 can be tapered, as discussed further below in connection with the SAW resonator or device 1300 in FIG. 26. In one implementation, additionally or alternatively, the IDT electrode 1110 and/or piezoelectric layer 1102 can be covered with a passivation layer (e.g., the passivation layer 1418 discussed further below in connection with the SAW resonator or device 1400 of FIG. 27).

Figure 25:
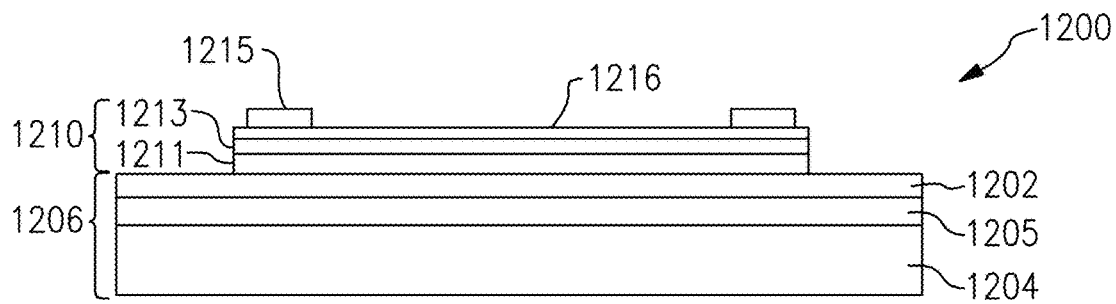
FIG. 25 illustrates a cross-section of a surface acoustic wave (SAW) device including a multi-layer interdigital transducer electrode.

FIG. 25 illustrates a cross-section of a surface acoustic wave (SAW) resonator or device 1200 including a multilayer interdigital transducer electrode 1210. The illustrated SAW resonator or device 1200 is similar to the SAW resonator or device 1100 in FIG. 24. Thus, reference numerals used to designate the various components of the SAW resonator 1200 are identical to those used for identifying the corresponding components of the SAW resonator 1100 in FIG. 24, except that the reference numerals begin with a "12" instead of an "11" (e.g., 1200 instead of 1100). Accordingly, the structure and description above for the various features of the SAW resonator 1100 in FIG. 24, which is based on the structure and description of the SAW resonator 100 in FIGS. 1A-1B, are understood to also apply to the corresponding features of the SAW resonator 1200 in FIG. 25, except as described below.

The SAW resonator 1200 differs from the SAW resonator 1100 in that the IDT electrode 1210 includes a third IDT layer (e.g., passivation layer) 1216 that is disposed above the second IDT layer 1213 and between the second IDT layer 1213 and the (mass loading strips) 1215. The third IDT layer 1216 can optionally be made of silicon dioxide (SiO2), silicon nitride (SiN), aluminum nitride (AlN) or titanium nitride (TiN). The third IDT layer 1216 can facilitate the manufacturing of the SAW resonator 1100. For example, the third IDT layer 1216 can have a different etching rate than the material of the (mass loading) strips 1215, to thereby act as a stop layer during etching of the material above the third IDT layer 1216 to form the strips 1215. Advantageously, the third IDT layer 1216 does not affect the performance of the IDT electrode 1210. In one implementation, side edges of the second IDT layer 1213 can be tapered, as discussed further below in connection with the SAW resonator or device 1300 in FIG. 26. In one implementation, additionally or alternatively, the IDT electrode 1210 and/or piezoelectric layer 1202 can be covered with a passivation layer (e.g., the passivation layer 1418 discussed further below in connection with the SAW resonator or device 1400 of FIG. 27).

Figure 26:
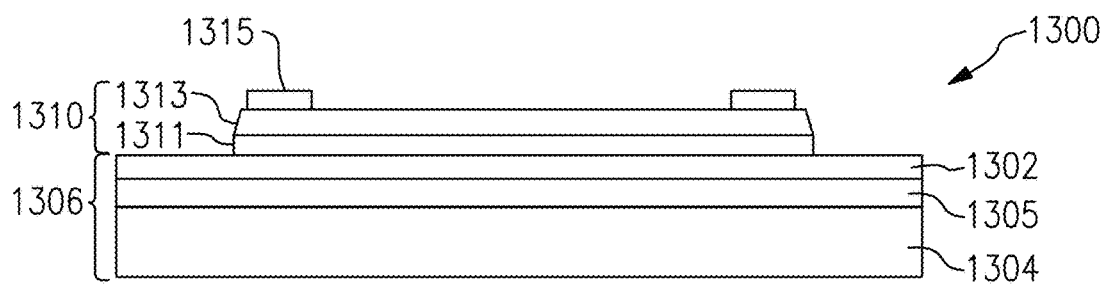
FIG. 26 illustrates a cross-section of a surface acoustic wave (SAW) device including a multi-layer interdigital transducer electrode.

FIG. 26 illustrates a cross-section of a surface acoustic wave (SAW) resonator or device 1300 including a multilayer interdigital transducer electrode 1310. The illustrated SAW resonator or device 1300 is similar to the SAW resonator or device 1100 in FIG. 24. Thus, reference numerals used to designate the various components of the SAW resonator 1300 are identical to those used for identifying the corresponding components of the SAW resonator 1100 in FIG. 24, except that the reference numerals begin with a "13" instead of an "11" (e.g., 1300 instead of 1100). Accordingly, the structure and description above for the various features of the SAW resonator 1100 in FIG. 24, which is based on the structure and description of the SAW resonator 100 in FIGS. 1A-1B, are understood to also apply to the corresponding features of the SAW resonator 1300 in FIG. 26, except as described below.

The SAW resonator 1300 differs from the SAW resonator 1100 in that the IDT electrode 1310 includes a second IDT layer 1313 that is tapered (e.g., side edges of the second IDT layer 1313 are tapered). Advantageously, having a tapered side edge for the second IDT layer 1313 facilitates the manufacturing of the IDT electrode 1310, as it is difficult to etch a vertical edge during manufacturing. Advantageously, the tapered second IDT layer 1313 does not substantially affect the performance of the IDT electrode 1310. In one implementation, the IDT electrode 1310 and/or piezoelectric layer 1302 can be covered with a passivation layer (e.g., the passivation layer 1418 discussed further below in connection with the SAW resonator or device 1400 of FIG. 27).

Figure 27:
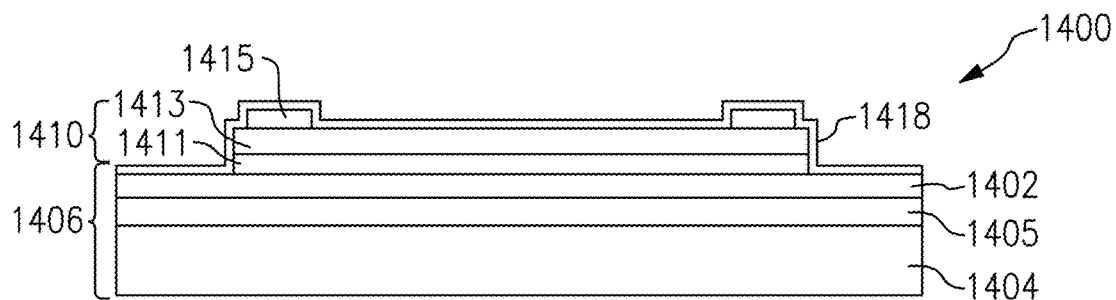
FIG. 27 illustrates a cross-section of a surface acoustic wave (SAW) device including a multi-layer interdigital transducer electrode.

FIG. 27 illustrates a cross-section of a surface acoustic wave (SAW) resonator or device 1400 including a multi-layer interdigital transducer electrode 1410. The illustrated SAW resonator or device 1400 is similar to the SAW resonator or device 1100 in FIG. 24. Thus, reference numerals used to designate the various components of the SAW resonator 1400 are identical to those used for identifying the corresponding components of the SAW resonator 1100 in FIG. 24, except that the reference numerals begin with a "14" instead of an "11" (e.g., 1400 instead of 1100). Accordingly, the structure and description above for the various features of the SAW resonator 1100 in FIG. 24, which is based on the structure and description of the SAW resonator 100 in FIGS. 1A-1B, are understood to also apply to the corresponding features of the SAW resonator 1400 in FIG. 27, except as described below.

The SAW resonator 1400 differs from the SAW resonator 1100 in that the IDT electrode 1410 is covered by a passivation layer 1418. As shown in FIG. 27, the passivation layer 1418 can also cover the piezoelectric layer 1402. The passivation layer 1418 can optionally be made of silicon dioxide (SiO2), silicon nitride (SiN), aluminum nitride (AlN) or titanium nitride (TiN). Advantageously, the passivation layer 1418 can improve the reliability of the IDT electrode 1410 and the SAW resonator 1400 (e.g., by inhibiting or preventing damage to the IDT electrode 1410 and/or the piezoelectric layer 1402 (e.g., from external or impact forces).

Figure 28:
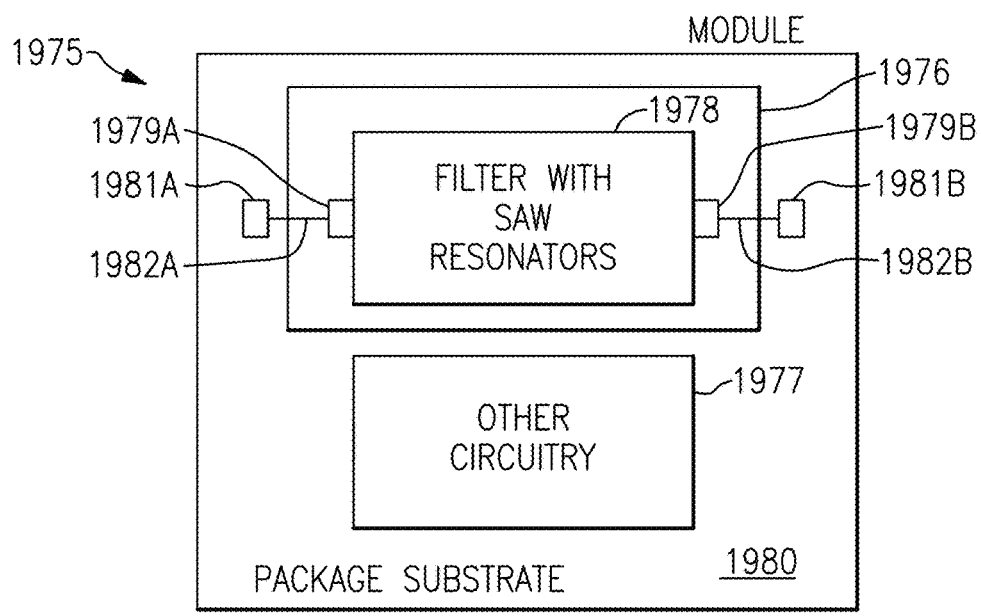
FIG. 28 is a schematic diagram of a radio frequency module that includes a surface acoustic wave component according to an embodiment.

FIG. 28 is a schematic diagram of a radio frequency module 1975 that includes a surface acoustic wave component 1976 according to an embodiment. The illustrated radio frequency module 1975 includes the SAW component 1976 and other circuitry 1977. The SAW component 1976 can include one or more SAW resonators or devices with any suitable combination of features of the SAW resonators or devices disclosed herein. The SAW component 1976 can include a SAW die that includes SAW resonators or devices. The SAW die can also include one or more MMS filters. Some or all of the SAW resonators or devices on the SAW die can include a velocity adjustment structure (e.g., by offsetting of mass loading strips, such as strips 515 in FIGS. 15A-15B).

The SAW component 1976 shown in FIG. 28 includes a filter 1978 and terminals 1979A and 1979B. The filter 1978 includes SAW resonators. One or more of the SAW resonators or devices can be SAW resonators including any suitable principles and advantages disclosed herein. The terminals 1979A and 1978B can serve, for example, as an input contact and an output contact. The SAW component 1976 and the other circuitry 1977 are on or supported by a common packaging substrate 1980 in FIG. 28. The package substrate 1980 can be a laminate substrate. The terminals 1979A and 1979B can be electrically connected to contacts 1981A and 1981B, respectively, on or supported by the packaging substrate 1980 by way of electrical connectors 1982A and 1982B, respectively. The electrical connectors 1082A and 1082B can be bumps or wire bonds, for example. The other circuitry 1977 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1975 can include one or more packaging structures to, for example, provide protection and/or facilitate easier handling of the radio frequency module 1975. Such a packaging structure can include an overmold structure formed over the packaging substrate 1975. The overmold structure can encapsulate some or all of the components of the radio frequency module 1975.

Figure 29:
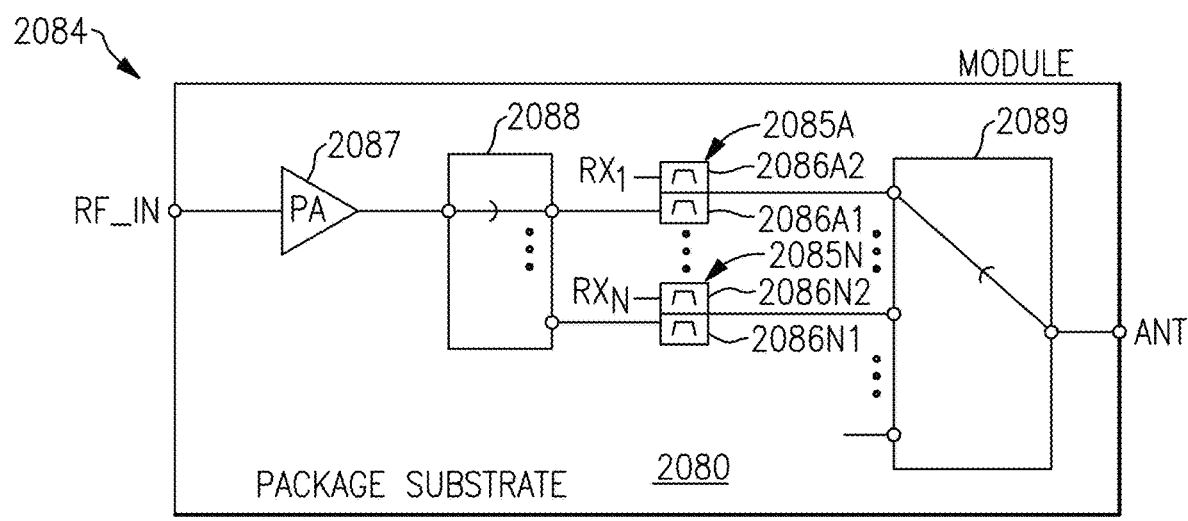
FIG. 29 is a schematic diagram of a radio frequency module that includes duplexers with surface acoustic wave resonators according to an embodiment.

FIG. 29 is a schematic diagram of a radio frequency module 2084 that includes a surface acoustic wave component according to an embodiment. As illustrated, the radio frequency module 2084 includes duplexers 2085A to 2085N that include respective transmit filters 2086A1 to 2086N1 and respective receive filters 2086A2 to 2086N2, a power amplifier 2087, a select switch 2088, and an antenna switch 2089. The radio frequency module 2084 can include a package that encloses the illustrated elements. The illustrated elements can be disposed on a common packaging substrate 2080. The packaging substrate can be a laminate substrate, for example.

The duplexers 2085A to 2085N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 2086A1 to 2086N1 can include one or more SAW resonators or devices in accordance with any suitable principles and advantages disclosed herein. Similarly, one or more of the receive filters 2086A2 to 2086N2 can include one or more SAW resonators or devices in accordance with any suitable principles and advantages disclosed herein. In certain embodiments, one or more of the receive filters 2086A2 to 2086N2 can include one or more SAW resonators or devices with a velocity adjustment structure (e.g., by offsetting of mass loading strips, such as strips 515 in FIGS. 15A-15B). Although FIG. 29 illustrates duplexers, any suitable principles and advantages disclosed herein can be implemented in other multiplexers (e.g., quadplexers, hexaplexers, octoplexers, etc.) and/or in switch-plexers.

The power amplifier 2087 can amplify a radio frequency signal. The illustrated switch 2088 is a multi-throw radio frequency switch. The switch 2088 can electrically couple an output of the power amplifier 2087 to a selected transmit filter of the transmit filters 2086A1 to 2086N1. In some instances, the switch 2088 can electrically connect the output of the power amplifier 2087 to more than one of the transmit filters 2086A1 to 2086N1. The antenna switch 2089 can selectively couple a signal from one or more of the duplexers 2085A to 2085N to an antenna port ANT. The duplexers 2085A to 2085N can be associated with different frequency bands and/or different modes of operation (e.g., different power modes, different signaling modes, etc.).

Figure 30:
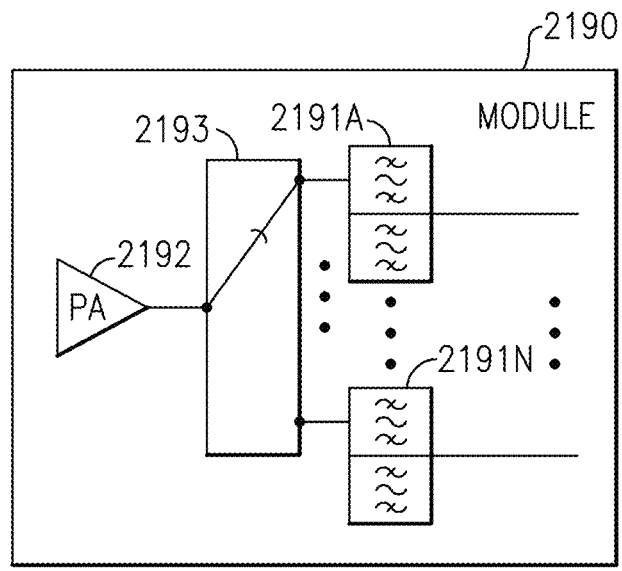
FIG. 30 is a schematic block diagram of a module that includes a power amplifier, a radio frequency switch, and duplexers that include one or more surface acoustic wave resonators according to an embodiment.

FIG. 30 is a schematic block diagram of a module 2190 that includes a power amplifier 2192, a radio frequency switch 2193, and duplexers 2191A to 1291N in accordance with one or more embodiments. The power amplifier 2192 can amplify a radio frequency signal. The radio frequency switch 2193 can be a multi-throw radio frequency switch. The radio frequency switch 2193 can electrically couple an output of the power amplifier 2192 to a selected transmit filter of the duplexers 2191A to 2191N. One or more filters of the duplexers 2191A to 2191N can include any suitable number of surface acoustic wave resonators or devices, in accordance with any suitable principles and advantages discussed herein. In certain embodiments, one or more filters of the duplexers 2191A to 2191N can include one or more SAW resonators or devices with a velocity adjustment structure (e.g., by offsetting of mass loading strips, such as strips 515 in FIGS. 15A-15B). Any suitable number of duplexers 2191A to 2191N can be implemented.

Figure 31:
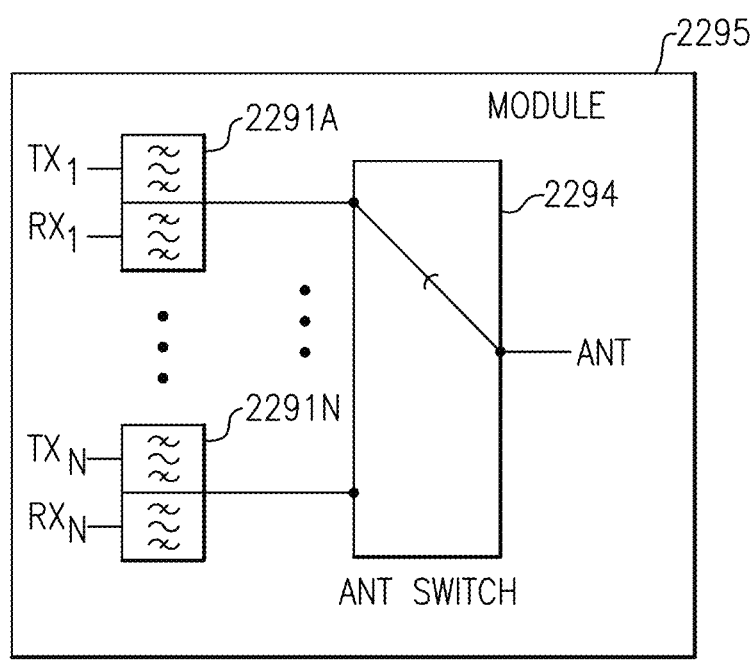
FIG. 31 is a schematic block diagram of a module that includes an antenna switch and duplexers that include one or more surface acoustic wave resonators according to an embodiment.

FIG. 31 is a schematic block diagram of a module 2295 that includes duplexers 2291A to 2291N and an antenna switch 2294. One or more filters of the duplexers 2291A to 2291N can include any suitable number of surface acoustic wave resonators or devices, in accordance with any suitable principles and advantages discussed herein. Any suitable number of duplexers 2291A to 2291N can be implemented. The antenna switch 2294 can have a number of throws corresponding to the number of duplexers 2291A to 2291N. The antenna switch 2294 can electrically couple a selected duplexer to an antenna port of the module 2295.

Figure 32:
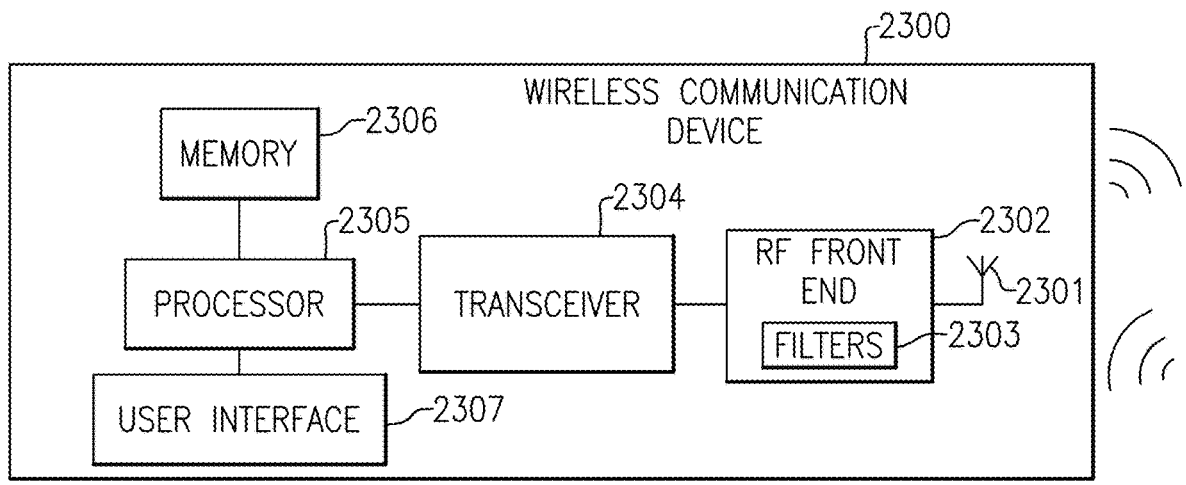
FIG. 32 is a schematic block diagram of a wireless communication device that includes a filter in accordance with one or more embodiments.

FIG. 32 is a schematic diagram of a wireless communication device 2300 that includes filters 2303 in a radio frequency front end 2302 according to an embodiment. The filters 2303 can include one or more SAW resonators or devices in accordance with any suitable principles and advantages discussed herein. The wireless communication device 2300 can be any suitable wireless communication device. For instance, a wireless communication device 2300 can be a mobile phone, such as a smart phone. As illustrated, the wireless communication device 2300 includes an antenna 2301, an RF front end 2302, a transceiver 2304, a processor 2305, a memory 2306, and a user interface 2307. The antenna 2301 can transmit RF signals provided by the RF front end 2302. Such RF signals can include carrier aggregation signals. Although not illustrated, the wireless communication device 2300 can include a microphone and a speaker in certain applications.

The RF front end 2302 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 2302 can transmit and receive RF signals associated with any suitable communication standards. The filters 2303 can include SAW resonators or devices of a SAW component that includes any suitable combination of features discussed with reference to any embodiments discussed above.

The transceiver 2304 can provide RF signals to the RF front end 2302 for amplification and/or other processing. The transceiver 2304 can also process an RF signal provided by a low noise amplifier of the RF front end 2302. The transceiver 2304 is in communication with the processor 2305. The processor 2305 can be a baseband processor. The processor 2305 can provide any suitable base band processing functions for the wireless communication device 2300. The memory 2306 can be accessed by the processor 2305. The memory 2306 can store any suitable data for the wireless communication device 2300. The user interface 2307 can be any suitable user interface, such as a display with touch screen capabilities.

Figure 33:
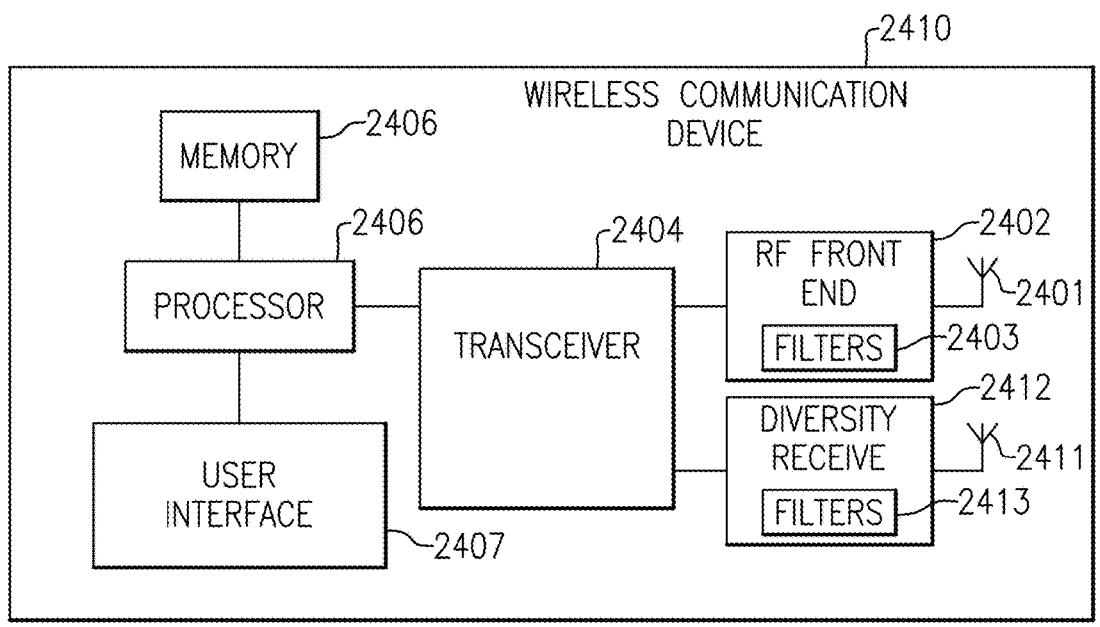
FIG. 33 is a schematic block diagram of another wireless communication device that includes a filter in accordance with one or more embodiments.

FIG. 33 is a schematic diagram of a wireless communication device 2410 that includes filters 2403 in a radio frequency front end 2402 and second filters 2413 in a diversity receive module 2412. The wireless communication device 2410 is like the wireless communication device 2300 of FIG. 32, except that the wireless communication device 2420 also includes diversity receive features. As illustrated in FIG. 33, the wireless communication device 2420 includes a diversity antenna 2411, a diversity module 2412 configured to process signals received by the diversity antenna 2411 and including filters 2413, and a transceiver 2404 in communication with both the radio frequency front end 1502 and the diversity receive module 2412. The filters 2413 can include one or more SAW resonators or devices that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. An acoustic wave device comprising:
a multilayer piezoelectric substrate including a piezoelectric layer and a support substrate below the piezoelectric layer; and
an interdigital transducer electrode including a first layer on the piezoelectric layer, a second layer on the first layer, the second layer being of a less dense material than the first layer, and a plurality of strips in contact with the second layer, each of the plurality of strips extending over an end portion of a respective finger but not extending over a region between fingers of the interdigital transducer electrode and having a density configured to suppress a transverse mode of the acoustic wave device.

2. The acoustic wave device of claim 1 wherein the multilayer piezoelectric substrate includes a functional layer interposed between the support substrate and the piezoelectric layer.

3. The acoustic wave device of claim 1 wherein each of the plurality of strips are disposed over an edge region of a respective finger of the interdigital transducer electrode.

4. The acoustic wave device of claim 1 wherein each of the plurality of strips is offset from a distal edge of a respective finger and toward a central region of the respective finger.

5. The acoustic wave device of claim 1 wherein the interdigital transducer electrode includes first bus bars that are on opposite sides of a plurality of fingers with gap portions between the first bus bars and ends the plurality of fingers, and second bus bars between the gap portions and ends of the plurality of fingers.

6. The acoustic wave device of claim 1 wherein side edges of the second layer of the interdigital transducer electrode are tapered.

7. The acoustic wave device of claim 1 further including a passivation layer disposed over the interdigital transducer electrode.

8. A radio frequency module comprising:
a package substrate;
an acoustic wave filter configured to filter a radiofrequency signal, the acoustic wave filter including an acoustic wave device that includes a multilayer piezoelectric substrate including a piezoelectric layer and a support substrate below the piezoelectric layer, and an interdigital transducer electrode including a first layer disposed over the piezoelectric layer, a second layer disposed over the first layer, the second layer being of a less dense material than the first layer, and a plurality of strips in contact with the second layer, each of the plurality of strips extending over an end portion of a respective finger but not extending over a region between fingers of the interdigital transducer electrode and having a density configured to suppress a transverse mode of the acoustic wave device; and
additional circuitry, the acoustic wave filter and additional circuitry disposed on the package substrate.

9. The radio frequency module of claim 8 wherein the multilayer piezoelectric substrate includes a functional layer interposed between the support substrate and the piezoelectric layer.

10. The radio frequency module of claim 8 wherein each of the plurality of strips are disposed over an edge region of a respective finger the interdigital transducer electrode.

11. The radio frequency module of claim 8 wherein each the plurality of strips is offset from a distal edge a respective finger and toward a central region of the respective finger.

12. The radio frequency module of claim 8 wherein the interdigital transducer electrode includes first bus bars that are on opposite sides of a plurality of fingers with gap portions between the first bus bars and ends the plurality of fingers, and second bus bars between the gap portions and ends of the plurality of fingers.

13. The radio frequency module of claim 8 wherein side edges of the second layer of the interdigital transducer electrode are tapered.

14. The radio frequency module of claim 8 further including a passivation layer disposed over the interdigital transducer electrode.

15. A wireless communication device comprising:
an antenna; and
a front end module including an acoustic wave filter configured to filter a radio frequency signal associated with the antenna, the acoustic wave filter including one or more acoustic wave devices that each include a multilayer piezoelectric substrate including a piezoelectric layer and a support substrate below the piezoelectric layer, and an interdigital transducer electrode including a first layer disposed over the piezoelectric layer, a second layer disposed over the first layer, the second layer being of a less dense material than the first layer, and a plurality of strips in contact with the second layer, each of the plurality of strips extending over an end portion of a respective finger but not extending over a region between fingers of the interdigital transducer electrode and having a density configured to suppress a transverse mode of the the one or more acoustic wave devices.

16. The wireless communication device of claim 15 wherein the multilayer piezoelectric substrate includes a functional layer interposed between the support substrate and the piezoelectric layer.

17. The wireless communication device of claim 15 wherein each of the plurality of strips is disposed over an edge region of a respective finger of the interdigital transducer electrode.

18. The wireless communication device of claim 15 wherein each of the plurality of strips is offset from a distal edge of a respective finger and toward a central region of the respective finger.

19. The wireless communication device of claim 15 wherein the interdigital transducer electrode includes first bus bars that are on opposite sides of a plurality of fingers with gap portions between the first bus bars and ends the plurality of fingers, and second bus bars between the gap portions and ends of the plurality of fingers.

20. The wireless communication device of claim 15 wherein side edges of the second layer of the interdigital transducer electrode are tapered.

21. The wireless communication device of claim 15 further including a passivation layer disposed over the interdigital transducer electrode.

* * * * *